United States Patent
Yamada et al.

(10) Patent No.: US 10,067,421 B2
(45) Date of Patent: *Sep. 4, 2018

(54) NEGATIVE PHOTOSENSITIVE RESIN COMPOSITION, CURED RESIN FILM, PARTITION WALLS AND OPTICAL ELEMENT

(71) Applicant: ASAHI GLASS COMPANY, LIMITED, Chiyoda-ku (JP)

(72) Inventors: Kotaro Yamada, Chiyoda-ku (JP); Keigo Matsuura, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 104 days.

This patent is subject to a terminal disclaimer.

(21) Appl. No.: 15/154,105

(22) Filed: May 13, 2016

(65) Prior Publication Data

US 2016/0252812 A1 Sep. 1, 2016

Related U.S. Application Data

(63) Continuation of application No. PCT/JP2014/083046, filed on Dec. 12, 2014.

(30) Foreign Application Priority Data

Dec. 17, 2013 (JP) .................. 2013-260083

(51) Int. Cl.
| | |
|---|---|
| C08F 2/46 | (2006.01) |
| C08G 61/04 | (2006.01) |
| G03F 7/038 | (2006.01) |
| G03F 7/027 | (2006.01) |
| H01L 51/00 | (2006.01) |
| G03F 7/004 | (2006.01) |
| G03F 7/075 | (2006.01) |
| C08F 283/10 | (2006.01) |
| C09D 151/08 | (2006.01) |

(52) U.S. Cl.
CPC .......... *G03F 7/038* (2013.01); *C08F 283/105* (2013.01); *C09D 151/08* (2013.01); *G03F 7/0046* (2013.01); *G03F 7/027* (2013.01); *G03F 7/0388* (2013.01); *G03F 7/0755* (2013.01); *G03F 7/0757* (2013.01); *H01L 51/0005* (2013.01)

(58) Field of Classification Search
CPC ...... G03F 7/038; G03F 7/0755; G03F 7/0046; G03F 7/0757; G03F 7/0388; G03F 7/027; H01L 51/0005; C08F 283/105; C08F 222/10; C08F 230/08; C09D 151/08
USPC .................................................. 522/1; 520/1
See application file for complete search history.

(56) References Cited

U.S. PATENT DOCUMENTS

| | | | | |
|---|---|---|---|---|
| 2011/0117333 | A1* | 5/2011 | Furukawa | G03F 7/0007 428/195.1 |
| 2013/0266778 | A1 | 10/2013 | Ishizeki | |
| 2015/0234273 | A1* | 8/2015 | Matsuura | G03F 7/0275 428/195.1 |

FOREIGN PATENT DOCUMENTS

| | | | |
|---|---|---|---|
| JP | 2010-185938 | 8/2010 | |
| JP | 2011-209443 | 10/2011 | |
| JP | 2013-209636 | 10/2013 | |
| WO | WO 2010/013654 A1 | 2/2010 | |
| WO | WO 2010/013816 A1 | 2/2010 | |
| WO | WO 2012/077770 A1 | 6/2012 | |
| WO | WO 2013/031737 A1 | 3/2013 | |
| WO | WO-2013058386 A1 * | 4/2013 | ............. C08G 77/26 |
| WO | WO 2013/161829 A1 | 10/2013 | |
| WO | WO 2014/084279 A1 | 6/2014 | |

OTHER PUBLICATIONS

Kawashima et al, WO 2013/058386 Machine Translation, Apr. 25, 2013 (Year: 2013).*
International Search Report dated Mar. 17, 2015 in PCT/JP2014/083046 filed on Dec. 12, 2014.

* cited by examiner

*Primary Examiner* — Jessica Whiteley
(74) *Attorney, Agent, or Firm* — Oblon, McClelland, Maier & Neustadt, L.L.P.

(57) ABSTRACT

A negative photosensitive resin composition comprising an alkali-soluble resin or alkali-soluble monomer which has a photo-curability, a photopolymerization initiator, and an ink repellent agent which has a fluorine atom content of from 1 to 45 mass % and which is a partially hydrolyzed condensate of a hydrolyzable silane compound mixture containing a hydrolyzable silane compound having a hydrolyzable group and an organic group having a polyfluoroalkyl group which has an etheric oxygen atom; a cured resin film and partition walls formed by using the negative photosensitive resin composition; and an optical element having the partition walls located between a plurality of dots and their adjacent dots on a substrate surface.

14 Claims, 5 Drawing Sheets

NEGATIVE PHOTOSENSITIVE RESIN COMPOSITION, CURED RESIN FILM, PARTITION WALLS AND OPTICAL ELEMENT

TECHNICAL FIELD

The present invention relates to a negative photosensitive resin composition, a cured resin film, partition walls and an optical element.

BACKGROUND ART

In the production of an optical element such as an organic EL (Electro-Luminescence) element, a method of pattern printing an organic layer such as a luminescent layer in the form of dots by an ink jet (IJ) method, may be employed. In such a method, partition walls are formed along the profiles of dots to be formed, and an ink containing the material for an organic layer is injected into compartments (hereinafter referred to also as opening sections) defined by the partition walls, followed by e.g. drying and/or heating, to form dots in a desired pattern.

In the above method, in order to prevent mixing of the ink between the adjacent dots and in order to uniformly apply the ink in forming the dots, the upper surface of the partition walls is required to have ink repellency, while the opening sections for forming dots as defined by the partition walls including the side surfaces of the partition walls are required to have ink-philicity.

Thus, in order to obtain partition walls having ink repellency on the upper surface, a method has been known to form partition walls corresponding to the pattern of dots by photolithography employing a photosensitive composition containing an ink repellent agent. For example, Patent Document 1 discloses a negative photosensitive resin composition containing a silicone-based ink repellent agent comprising a hydrolyzed condensate of a fluorinated hydrolysable silane compound.

The negative photosensitive resin composition disclosed in Patent Document 1 is one capable of providing sufficient ink repellency to the upper surface of partition walls, however, in recent years, with a view to preventing mixing of ink that is feared to occur along with miniaturization, complexity, etc. of patterns of dots, among the ink repellency of the upper surface of partition walls, particularly a nature of low dynamic contact angle is now demanded. That is, heretofore, the ink repellency was evaluated by the static contact angle being high (i.e. low wettability), however, for example, at the time of injecting ink into opening sections, if the ink is, by mistake, supplied to the upper surface of partition walls, in order to facilitate the ink to move (drop) to opening sections, it is now required to be excellent in the ink dropping properties, in addition to the static contact angle being high.

PRIOR ART DOCUMENT

Patent Document

Patent Document: WO 2010/013816

DISCLOSURE OF INVENTION

Technical Problem

The present invention has an object to provide a negative photosensitive resin composition which can impart good ink repellency, particularly good ink dropping properties, to the upper surface of partition walls.

The present invention has an object to provide a cured resin film and partition walls having good ink repellency on the upper surface.

The present invention further has an object to provide an optical element having dots formed with good precision by an ink uniformly applied in opening sections partitioned by partition walls.

Solution to Problem

The present invention provides a cured resin film, a negative photosensitive resin composition, partition walls and an optical element, having the following constructions [1] to [13].

[1] A cured resin film formed on a substrate and characterized in that in a composition analysis at the surface of the cured resin film and a composition analysis in the thickness direction of the cured resin film by X-ray photoelectron spectroscopy (XPS), at least at the surface of the cured resin film, peaks indicating the presence of silicon atoms and carbon atoms derived from —O—$CF_2$— groups are measured, the ratio of the concentration of carbon atoms derived from —O—$CF_2$— groups to the concentration of carbon atoms derived from substituted or unsubstituted non-fluorinated hydrocarbon groups, at the surface of the cured resin film, i.e. $[C_{FO}/C_H]_{(s)}$, is larger than the ratio of the concentration of carbon atoms derived from —O—$CF_2$— groups to the concentration of carbon atoms derived from substituted or unsubstituted non-fluorinated hydrocarbon groups, at the interior of the cured resin film, i.e. $[C_{FO}/C_H]_{(i)}$, and the ratio of the concentration of silicon atoms to the concentration of carbon atoms derived from substituted or unsubstituted non-fluorinated hydrocarbon groups, at the surface of the cured resin film, i.e. $[Si/C_H]_{(s)}$, is larger than the ratio of the concentration of silicon atoms to the concentration of carbon atoms derived from substituted or unsubstituted non-fluorinated hydrocarbon groups, at the interior of the cured resin film, i.e. $[Si/C_H]_{(i)}$.

[2] A negative photosensitive resin composition characterized by comprising (A) an alkali-soluble resin or alkali-soluble monomer, which has a photo-curability, (B) a photopolymerization initiator, and (C) an ink repellent agent which has a fluorine atom content of from 1 to 45 mass % and which is a partially hydrolyzed condensate of a hydrolyzable silane compound mixture containing a hydrolyzable silane compound (s1) having a hydrolyzable group and a $C_{2-40}$ monovalent group represented by $R^{f1}OR^{f2}$— (where $R^{f1}$ is a $C_{1-6}$ polyfluoroalkyl group, and $R^{f2}$ is a polyfluoroalkylene group which may have an etheric oxygen atom between carbon-carbon atoms, provided that $R^{f1}OR^{f2}$— has at least one —O—$CF_2$— group).

[3] The negative photosensitive resin composition according to [2], wherein the hydrolyzable silane compound (s1) is a compound represented by the following formula (cx-1):

$$(R^{f1}OR^{f2}-Q^1)_a-Si(R^{H1})_bX^1_{(4-a-b)} \quad \text{(CX-1)}$$

where $Q^1$ represents a $C_{1-10}$ divalent organic group containing no fluorine atom, $R^{H1}$ represents a $C_{1-6}$ monovalent hydrocarbon group, a represents 1 or 2, and b represents 0 or 1, provided a+b is 1 or 2, and $X^1$ represents a hydrolyzable group.

[4] The negative photosensitive resin composition according to [2] or [3], wherein $R^{f1}$ is a perfluoroalkyl group, and $R^{f2}$ is a perfluoroalkylene group.

[5] The negative photosensitive resin composition according to any one of [2] to [4], wherein the hydrolyzable silane compound mixture further contains a hydrolyzable silane compound (s2) having four hydrolyzable groups bonded to a silicon atom.

[6] The negative photosensitive resin composition according to any one of [2] to [5], wherein the hydrolyzable silane compound mixture further contains a hydrolyzable silane compound (s3) having a group containing an ethylenic double bond and a hydrolyzable group and containing no fluorine atoms.

[7] The negative photosensitive resin composition according to any one of [2] to [6], wherein the fluorine atom content of the ink repellent agent (C) is at least 2 mass % and less than 10 mass %.

[8] The negative photosensitive resin composition according to any one of [2] to [7], which further contains a cross-linking agent (D) having at least two ethylenic double bonds in one molecule and having no acidic group.

[9] A cured resin film characterized in that it is formed by using the negative photosensitive resin composition as defined in any one of [2] to [8].

[10] The cured resin film according to [9] formed on a substrate and characterized in that in a composition analysis at the surface of the cured resin film and a composition analysis in the thickness direction of the cured resin film by X-ray photoelectron spectroscopy (XPS), at least at the surface of the cured resin film, peaks indicating the presence of silicon atoms and carbon atoms derived from —O—CF$_2$— groups are measured, the ratio of the concentration of carbon atoms derived from —O—CF$_2$— groups to the concentration of carbon atoms derived from substituted or unsubstituted non-fluorinated hydrocarbon groups, at the surface of the cured resin film, i.e. $[C_{FO}/C_H]_{(s)}$, is larger than the ratio of the concentration of carbon atoms derived from —O—CF$_2$— groups to the concentration of carbon atoms derived from substituted or unsubstituted non-fluorinated hydrocarbon groups, at the interior of the cured resin film, i.e. $[C_{FO}/C_H]_{(i)}$, and the ratio of the concentration of silicon atoms to the concentration of carbon atoms derived from substituted or unsubstituted non-fluorinated hydrocarbon groups, at the surface of the cured resin film, i.e. $[Si/C_H]_{(s)}$, is larger than the ratio of the concentration of silicon atoms to the concentration of carbon atoms derived from substituted or unsubstituted non-fluorinated hydrocarbon groups, at the interior of the cured resin film, i.e. $[Si/C_H]_{(i)}$.

[11] Partition walls formed to partition a substrate surface into a plurality of compartments for forming dots and characterized by being made of the cured resin film as defined in [1], [9] or [10].

[12] An optical element having partition walls located between a plurality of dots and their adjacent dots on a substrate surface and characterized in that said partition walls are formed of the partition walls as defined in [11].

[13] The optical element according to [12], wherein the dots are formed by an ink jet method.

Advantageous Effects of Invention

According to the present invention, it is possible to provide a negative photosensitive resin composition capable of imparting good ink repellency, particularly good ink-dropping properties, to the upper surface of partition walls, and a cured resin film having the composition cured.

The cured resin film and partition walls of the present invention have good ink repellency on the upper surface.

The optical element of the present invention is an optical element having dots formed with good precision by an ink uniformly applied in opening sections partitioned by partition walls.

DESCRIPTION OF EMBODIMENTS

Figure 1A:
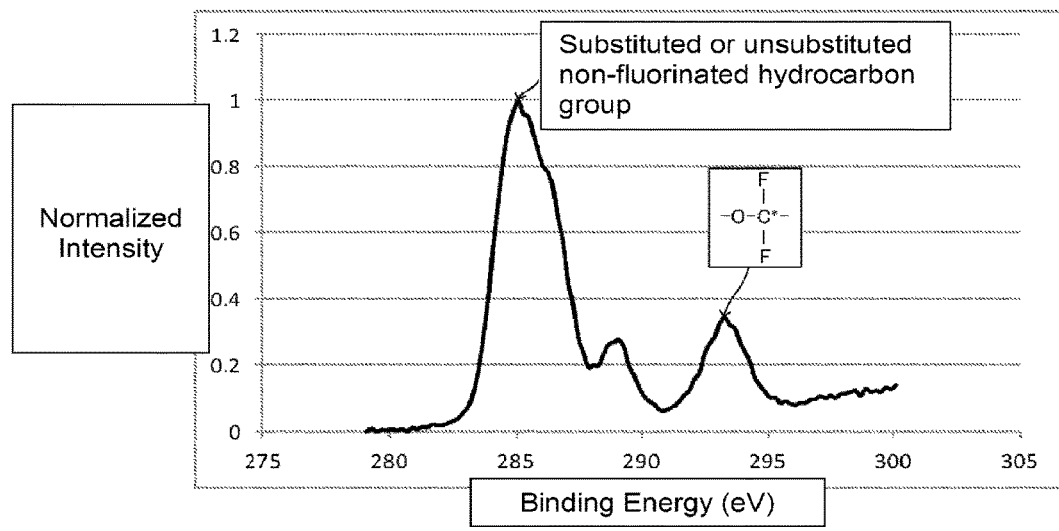
FIG. 1A is a chart showing the results of a composition analysis (C1s) at the surface, by XPS, of a cured resin film in an Example of the present invention.

In this specification, a "(meth)acryloyl group" is a general term for a "methacryloyl group" and an "acryloyl group". The same applies to a (meth)acryloyloxy group, (meth)acrylic acid, a (meth)acrylate, a (meth)acrylamide and a (meth)acrylic resin.

In this specification, a group represented by the formula (x) may sometimes be referred to simply as a group (x).

In this specification, a compound represented by the formula (y) may sometimes be referred to simply as a compound (y).

Here, the formula (x) and the formula (y) represent optional formulae.

In this specification, a "side chain" is a group other than a hydrogen or halogen atom, bonded to a carbon atom constituting a main chain in a polymer wherein repeating units constitute the main chain.

In this specification, "the total solid content in the photosensitive resin composition" is meant for components to form a cured resin film described later, among components contained in the photosensitive resin composition and is obtained from a residue remaining after heating the photosensitive resin composition at 140° C. for 24 hours to remove any solvent. Here, the total solid content amount may also be calculated from the charged amounts.

In this specification, a film made of a cured product of a composition containing a resin as the main component, is referred to as a "cured resin film".

In this specification, a film formed by coating with a photosensitive resin composition is referred to as a "coating film" and a film formed by drying it, is referred to as a "dried film". A film obtainable by curing such a "dried film" is a "cured resin film". Further, in this specification, a "cured resin film" may sometimes be referred to simply as a "cured film".

The cured resin film may be in the form of partition walls formed to partition a prescribed region into a plurality of compartments. Into the compartments partitioned by the partition walls i.e. opening sections surrounded by the partition walls, for example, the following "ink" is injected to form "dots".

In this specification, an "ink" is a general term for a liquid having optical and/or electrical functions after being dried, cured, etc.

In optical elements such as an organic EL element, a color filter for liquid crystal element and a TFT (Thin Film Transistor) array, dots as various constituent elements may be pattern-printed by an ink jet (IJ) method using inks to form such dots. The "ink" in this specification includes inks to be used in such applications.

In this specification, "ink repellency" is a nature to repel such an ink and has both water repellency and oil repellency. The ink repellency may be evaluated, for example, by a static contact angle as an index for wettability at the surface of a test sample when an ink is dropped thereon, or by a dynamic contact angle as an index for movability at the test sample surface, e.g. dropping properties of an ink from the partition walls into opening sections (hereinafter referred to also as "ink dropping properties"). Whereas, "ink-philicity" is a nature opposite to ink repellency and may be evaluated by a static contact angle when an ink is dropped, in the same manner as for ink repellency.

In this specification, a "dot" represents an optically modulatable minimum region in an optical element. In optical elements such as an organic EL element, a color filter for liquid crystal element and a TFT array, in the case of black and white presentation, 1 dot=1 pixel, and in the case of colored presentation, e.g. 3 dots (R (red), G (green) and B (blue))=1 pixel.

Now, embodiments of the present invention will be described. In this specification, % represents mass % unless otherwise specified.

[Cured Resin Film According to First Embodiment]

The cured resin film according to a first embodiment of the present invention is a cured resin film formed on a substrate and having the following characteristics (I), (II) and (III) in a composition analysis at the surface of the cured resin film and a composition analysis in the thickness direction of the cured resin film, by XPS (X-ray photoelectron spectroscopy).

(I) At least at the surface of the cured resin film, peaks indicating the presence of silicon atoms and carbon atoms derived from —O—$CF_2$— groups are measured, (II) The ratio of the concentration of carbon atoms derived from —O—$CF_2$— groups to the concentration of carbon atoms derived from substituted or unsubstituted non-fluorinated hydrocarbon groups, at the surface of the cured resin film, i.e. $[C_{FO}/C_H]_{(s)}$, is larger than the ratio of the concentration of carbon atoms derived from —O—$CF_2$— groups to the concentration of carbon atoms derived from substituted or unsubstituted non-fluorinated hydrocarbon groups, at the interior of the cured resin film, i.e. $[C_{FO}/C_H]_{(i)}$.

(III) The ratio of the concentration of silicon atoms to the concentration of carbon atoms derived from substituted or unsubstituted non-fluorinated hydrocarbon groups, at the surface of the cured resin film, i.e. $[Si/C_H]_{(s)}$, is larger than the ratio of the concentration of silicon atoms to the concentration of carbon atoms derived from substituted or unsubstituted non-fluorinated hydrocarbon groups, at the interior of the cured resin film, i.e. $[Si/C_H]_{(i)}$.

Here, in this specification, the "surface" of a cured resin film is the main surface on the side opposite to the substrate side of the cured resin film. In this specification, the "upper surface" of partition walls or a cured resin film has the same meaning as such a surface.

The "interior" of the cured resin film is meant for a region on the substrate side from the ½ position in thickness of the cured resin film, from the surface of the cured resin film.

With respect to the cured resin film of the present invention, so long as it has characteristics satisfying the above (I), (II) and (III) in the composition analyses at the surface and in the thickness direction by XPS, the film thickness is not particularly limited. The film thickness of the cured resin film may be suitably selected depending on the application, and is preferably from 0.05 to 50 μm, particularly preferably from 0.2 to 10 μm.

The analysis of the sample surface by XPS is a method for analyzing the composition and chemical bonding state of the surface by irradiating the sample with X-rays and measuring the energy of photoelectrons emitted from the sample surface. Further, the analysis in the thickness direction becomes possible by combined use of sputtering employing an ion beam that is provided in the apparatus. Here, in the case of carrying out the analysis in the thickness direction of an organic material such as a cured resin film of the present invention, it is known to damage the sample surface depending on the type of the ion beam to be irradiated. Therefore, in the composition analysis in the thickness direction of a cured resin film, it is necessary to select the type of the ion beam to be irradiated. In the present invention, an analysis by Ar cluster sputtering ions is preferred whereby substantially no chemical change attributable to irradiation ions is observed on the surface after etching.

As a device capable of XPS analysis by Ar cluster sputtering ions, PHI5000 VersaProbe II, manufactured by ULVAC-PHI, Inc., may, for example, be mentioned. As a method for composition analysis in the thickness direction by XPS of a cured resin film using such an apparatus, a conventional method for analysis in the thickness direction of an organic film by the apparatus can be applied without any particular limitation.

Here, in the XPS analysis at only the surface of a cured resin film, it is not necessary to use an ion beam. Therefore, in the following, with respect to the surface of a cured resin film, a specific example of XPS analysis in the case of using Quantera-SXM, manufactured by ULVAC-PHI, Inc. will be described. However, for the above reason, in the case of analyzing the internal composition of a cured resin film by XPS, it is preferred to carry out the measurement by using Ar cluster sputtering ions.

Here, in the above (II), in the case of comparing $[C_{FO}/C_H]_{(s)}$ at the surface of the cured resin layer and $[C_{FO}/C_H]_{(i)}$ at the interior of the cured resin film, and in the above (III), in the case of comparing $[Si/C_H]_{(s)}$ at the surface of the cured resin film and $[Si/C_H]_{(i)}$ at the interior of the cured resin film, it is preferred to conduct XPS analyses of the surface and the interior of the cured resin film by using the same device under the same conditions.

Figure 1B:
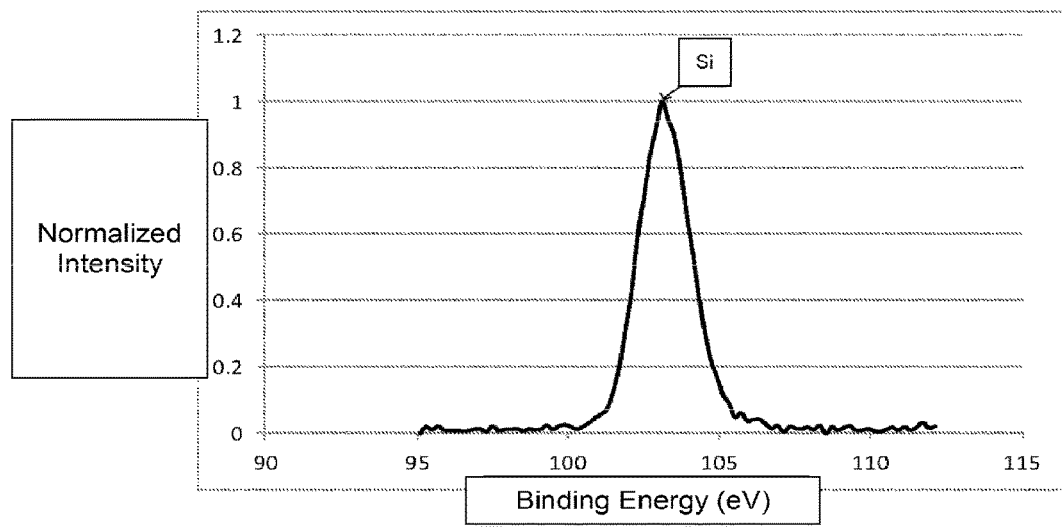
FIG. 1B is a chart showing the results of a composition analysis (Si2p) at the surface, by XPS, of a cured resin film in an Example of the present invention.
Figure 1C:
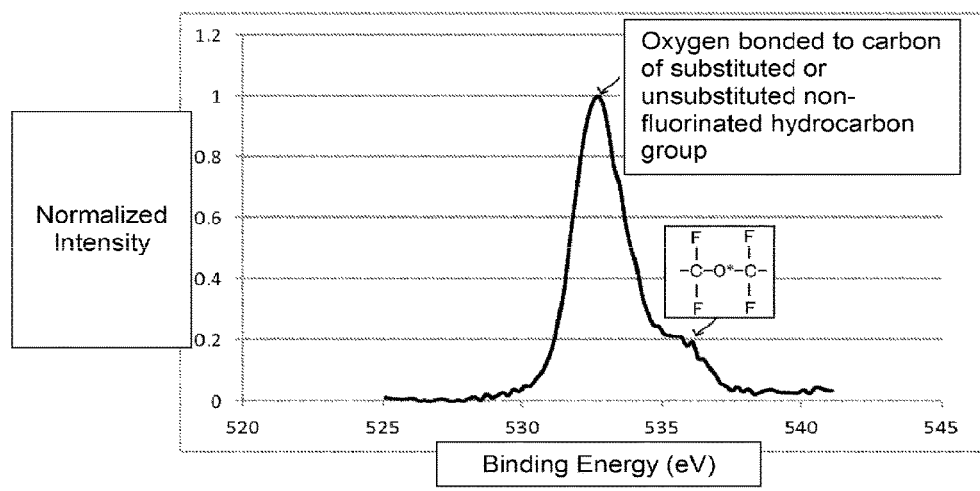
FIG. 1C is a chart showing the results of a composition analysis (O1s) at the surface, by XPS, of a cured resin film in an Example of the present invention.
Figure 1D:
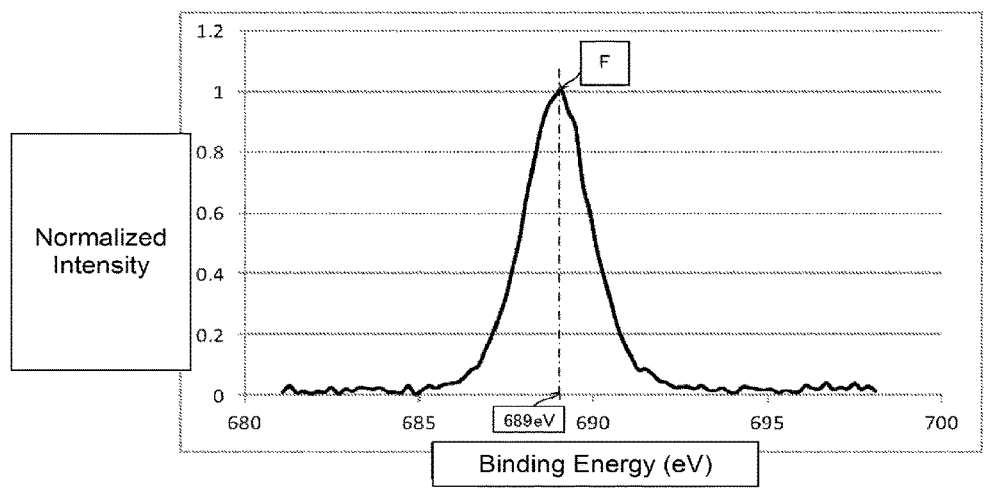
FIG. 1D is a chart showing the results of a composition analysis (F1s) at the surface, by XPS, of a cured resin film in an Example of the present invention.

FIG. 1A to FIG. 1D show the results of composition analyses of the surface by XPS of an example of the cured resin film of the present invention. FIG. 1A shows the analytical results of C1s by XPS at the time of analyzing the surface of partition walls made of a cured resin film obtained in Ex. 2 in Examples described below, by means of Quantera-SXM, under the following analytical conditions. Likewise, FIG. 1B shows the analytical results of Si2p, FIG. 1C shows the analytical results of O1s, and FIG. 1D shows the analytical results of F1s. Here, the measurement conditions are as follows. In FIG. 1A and FIG. 1C, the structural formula corresponding to a peak is shown, and such a peak is a peak derived from the element identified by "*" in the structural formula.

(Analytical Conditions)
X-ray source: $AlK_\alpha$
X-ray power: 25W, 15 kV
X-ray spot size: about 100 μmφ
Analysis area (X-ray raster size): 800×300 μm²
Detection Angle: 45° to the sample surface
Neutralizing gun: Yes
Acq. Cycles: 1
Region Names of the measured peaks: C1s, O1s, F1s, Si2p
Measurement order: 1st (C1s), 2nd (O1s), 3rd (F1s), 4th (Si2p)
Acquisition Lower: 279 eV (C1s), 525 eV (O1s), 681 eV (F1s), 95 eV (Si2p)
Acquisition Width: 21 eV (C1s), 16 eV (O1s), 17 eV (F1s), 17 eV (Si2p)
No. of Sweeps: 8 (C1s), 4 (O1s), 2 (F1s), 32 (Si2p)
Pass Energy: 112.00 eV
Step Size: 0.200 eV
Ratio: 4

Here, the peak of carbon atoms derived from —O—$CF_2$— groups tends to decrease by X-ray damage. In consideration of this influence, it is necessary to take a due care such as shortening of the measurement time. In the above measurement, in consideration of this influence, "Acq. Cycles" is set to be once, and the measurement order for C1s is set to be the first. Here, "Binding Energy (eV)" on the abscissa of the XPS spectrum was calibrated by taking the apex of the peak of F1s as 689.0 eV.

The respective atomic concentrations of carbon atoms, oxygen atoms, fluorine atoms and silicon atoms, respectively calculated from the peak areas of the respective peaks derived from C1s, O1s, F1s and Si2p, of the XPS spectrum at the surface of partition walls made of a cured resin film, as measured by the above conditions (Ex. 2 in Examples) are shown in Table 1. Further, by analyzing the respective peak areas of C1s, O1s, F1s and Si2p as described above, it is possible to know the existence ratios of carbon atoms, oxygen atoms, fluorine atoms and silicon atoms at the surface of the cured resin film.

Further, from the XPS spectrum of C1s as shown in FIG. 1A, the atomic concentration of C1s derived from substituted or unsubstituted non-fluorinated hydrocarbon groups and the atomic concentration of C1s derived from —O—$CF_2$— groups were obtained. Here, in this specification, carbon atoms derived from substituted or unsubstituted non-fluorinated hydrocarbon groups are meant for carbon atoms which are not bonded to a fluorine atom and which are bonded to an atom selected from the group consisting of a hydrogen atom, an oxygen atom, other carbon atom and a nitrogen atom. Here, a value obtained by subtracting the atomic concentration of C1s derived from substituted or unsubstituted non-fluorinated hydrocarbon groups and the atomic concentration of C1s derived from —O—$CF_2$— groups from the atomic concentration of all carbon atoms as obtained above, is taken as the atomic concentration of C1s derived from other carbon atoms.

Specifically, the atomic concentration of C1s derived from substituted or unsubstituted non-fluorinated hydrocarbon groups, corresponds, for example, to the area of a peak having the maximum value in the vicinity of 285.0 eV, as shown in the XPS spectrum in FIG. 1A. Further, the atomic concentration of C1s derived from —O—$CF_2$— groups, corresponds, for example, to the area of a peak having the maximum value in the vicinity of 293.3 eV, as shown in the XPS spectrum in FIG. 1A.

From the atomic concentration of C1s derived from substituted or unsubstituted non-fluorinated hydrocarbon groups, and the atomic concentration of C1s derived from —O—$CF_2$— groups thus obtained, the atomic concentration ratio of the two can be calculated.

The carbon atom concentration derived from substituted or unsubstituted non-fluorinated hydrocarbon groups, is represented as "$C_H$" in this specification. Further, the carbon atom concentration derived from —O—$CF_2$— groups is represented as "$C_{FO}$" in this specification. Here, the concentration of all carbon atoms is referred to as "$C_{all}$", and a value obtained by subtracting $C_H$ and $C_{FO}$ from $C_{all}$ is represented as "$C_{ot}$", as the concentration of other carbon atoms. Further, the atomic concentrations shown in Table 1 are represented by the same abbreviations as above.

TABLE 1

| | Analytical peaks | | | | | | |
|---|---|---|---|---|---|---|---|
| | C1s | | | | O1s Oxygen | F1s Fluorine | Si2p silicon |
| Type of atom | $C_H$ | $C_{FO}$ | $C_{ot}$ | $C_{all}$ | | | |
| Atomic concentration of each atom (atomic %) | 35.5 | 6.5 | 4.3 | 46.3 | 27.9 | 21.4 | 4.4 |

As shown in FIG. 1A, FIG. 1B and Table 1, in the XPS spectrum at the surface of the cured resin film, a peak indicating the presence of carbon atoms derived from —O—$CF_2$— groups and a peak indicating the presence of silicon atoms, are measured.

Here, the ratio of $C_{FO}$ to $C_H$ at the surface of the cured resin film, i.e. $[C_{FO}/C_H]_{(s)}$, is calculated as (atomic concentration of C1s derived from —O—$CF_2$— groups/atomic concentration of C1s derived from substituted or unsubstituted non-fluorinated hydrocarbon groups) by using the atomic concentrations shown in Table 1, to obtain 0.18 as the value of the ratio. Here, (s) in $[C_{FO}/C_H]_{(s)}$ means that the measurement was made at the surface. Hereinafter, (s) in $[\ ]_{(s)}$ has the same meaning.

Further, the ratio of the concentration of silicon atoms to $C_H$ at the surface of the cured resin film, i.e. $[Si/C_H]_{(s)}$, is calculated to be 0.12 from Table 1.

Thus, $[C_{FO}/C_H]_{(s)}$ and $[Si/C_H]_{(s)}$ at the surface of the cured resin film are obtained.

Further, in the case of analyzing the composition at the interior of the cured resin film by XPS, the XPS analysis is conducted by using Ar cluster sputtering ions, and from the atomic concentrations of the respective atoms thereby obtained in the same manner as above, $[C_{FO}/C_H]_{(i)}$ and $[Si/C_H]_{(i)}$ will be calculated (wherein (i) means that the measurement was made at the interior; hereinafter, (i) in $[\ ]_{(i)}$ has the same meaning). In the above (II), at the time of comparing $[C_{FO}/C_H]_{(s)}$ and $[C_{FO}/C_H]_{(i)}$, $[C_{FO}/C_H]_{(s)}$ obtained as described above may be compared with $[C_{FO}/C_H]_{(i)}$ at the interior of the cured resin film as obtained by conducting the XPS analysis by using Ar cluster sputtering ions, but it is preferred to compare those obtained by XPS analyses by means of the same device under the same conditions. The same applies in the case where in (III), $[Si/C_H]_{(s)}$ and $[Si/C_H]_{(i)}$ are compared.

In the cured resin film of the present invention, when $[C_{FO}/C_H]_{(s)}$ and $[C_{FO}/C_H]_{(i)}$ obtained as described above, are compared, a relationship of $[C_{FO}/C_H]_{(s)} > [C_{FO}/C_H]_{(i)}$ is satisfied.

Further, in the cured resin film of the present invention, when the ratio of the concentration of silicon atoms to $C_H$ at the surface of the cured resin film, i.e. $[Si/C_H]_{(s)}$, and the ratio of the concentration of silicon atoms to $C_H$ at the interior of the cured resin film, i.e. $[Si/C_H]_{(i)}$ obtained as described above, are compared, a relationship of $[Si/C_H]_{(s)} > [Si/C_H]_{(i)}$ is satisfied.

The cured resin film of the present invention thus characterized in that by the XPS analysis, at least at the surface, the presence of silicon atoms and carbon atoms derived from —O—$CF_2$ groups is confirmed, and relationships of $[C_{FO}/C_H]_{(s)} > [C_{FO}/C_H]_{(i)}$ and $[Si/C_H]_{(s)} > [Si/C_H]_{(i)}$ are both satisfied, is such a cured resin film that its surface has good ink repellency, and especially when partition walls are constituted by using it, the surface of the partition walls will have good ink-dropping properties.

Further, for example, in a case where a cured resin film which is disposed inside a device, is to be analyzed by means of XPS, it is necessary to expose the cured resin film from the device. In the following, an example of a method for exposing the surface of the cured resin film which is disposed inside a device will be described, but the exposing method is not limited to the following.

As a method for exposing the surface of the cured resin film which is disposed inside a device, for example, Surface And Interfacial Cutting Analysis System (hereinafter referred to as SAICAS) may be mentioned. By using the exposing method using SAICAS, for example, in a case where the device is an organic EL display, the cover glass is removed, and the laminate including the exposed light emitting layer and partition walls (cured resin film) is collectively cut obliquely to the depth direction, whereby it becomes possible to expose the surface of the partition walls.

Similarly, in a case where the device is an organic EL display, by using an exposing method using XPS, a thin film at the top of partition walls (cured resin film) is removed by a sputtering gun of e.g. argon, cesium, oxygen, gallium, gold, etc. build in the device, whereby it is possible to expose the surface of partition walls.

Or, by using an exposing method using chemical etching, in a case where the device is an organic EL display, one or both of electrodes disposed on and below partition walls may be dissolved by an acid or alkali to form spaces on and below the partition walls, thereby to peel the laminate, whereby it becomes possible to expose the surface of partition walls.

The cured resin film of the present invention is a cured resin film formed on a substrate, and it is not particularly limited so long as it has composition characteristics of the above (II) and (III) by analyses using XPS. The cured resin film of the present invention having such characteristics can be formed on a substrate, for example, by using the negative photosensitive resin composition of the present invention which will be described below.

[Negative Photosensitive Resin Composition]

The negative photosensitive resin composition of the present invention comprises an alkali-soluble resin or alkali-soluble monomer (A) which has a photo-curability, a photopolymerization initiator (B), and an ink repellent agent (C) which has a fluorine atom content of from 1 to 45 mass % and which is a partially hydrolyzed condensate of a hydrolyzable silane compound mixture containing a hydrolyzable silane compound (s1) having a hydrolyzable group and a $C_{2-40}$ monovalent group represented by $R^{f1}OR^{f2}$— (where $R^{f1}$ is a $C_{1-6}$ polyfluoroalkyl group, and $R^{f2}$ is a polyfluoroalkylene group which may have an etheric oxygen atom between carbon-carbon atoms, provided that $R^{f1}OR^{f2}$— has at least one —O—$CF_2$— group).

The negative photosensitive resin composition of the present invention may further contain, as the case requires, a crosslinking agent (D), a solvent (E), a coloring agent (F), or other optional components.

Now, the respective components will be described.

(Alkali-Soluble Resin or Alkali-Soluble Monomer (A))

By assigning a reference symbol (AP) to the alkali-soluble resin and a reference symbol (AM) to the alkali-soluble monomer, they will be described respectively.

The alkali-soluble resin (AP) is preferably a photosensitive resin having an acidic group and an ethylenic double bond in one molecule. Since the alkali-soluble resin (AP) has an ethylenic double bond in the molecule, an exposed portion of the negative photosensitive resin composition will be cured as polymerized by radicals generated from the photopolymerization initiator (B).

The exposed portion thus cured will not be removed by an alkali developer. Further, since the alkali-soluble resin (AP) has an acidic group in the molecule, an unexposed portion of the negative photosensitive resin composition which is not cured, can be selectively removed by an alkaline developing solution. As a result, a cured film can be made in the form of partition walls for partitioning a predetermined region into a plurality of compartments.

The acidic group may, for example, be a carboxy group, a phenolic hydroxy group, a sulfo group, a phosphoric acid group, etc. and one type of these may be used alone, or two or more types of them may be used in combination.

The ethylenic double bond may, for example, be addition-polymerizable double bonds such as a (meth) acryloyl group, an allyl group, a vinyl group, a vinyloxy group and a vinyl oxyalkyl group. One type of these may be used alone, or two or more types of them may be used in combination. Here, some or all of hydrogen atoms contained in the ethylenic double bond, may be substituted by an alkyl group such as a methyl group.

The alkali-soluble resin (AP) may, for example, be a resin (A-1) having a side chain with an acidic group, and a side chain with an ethylenic double bond, and a resin (A-2) having an acid group and an ethylenic double bond introduced to an epoxy resin. One type of these may be used alone, or two or more types of them may be used in combination.

Here, the above-mentioned epoxy resin is meant for a compound having two or more epoxy groups (i.e. a polyepoxide), and it is a compound to be used as a base resin for a curable epoxy resin.

The resin (A-1) may, for example, be a vinyl resin having a side chain with an acidic group, and a side chain with an ethylenic double bond.

The resin (A-2) may, for example, be a resin obtainable by reacting an epoxy resin with a compound having a carboxy group and an ethylenic double bond, followed by reacting a polyvalent carboxylic acid or its anhydride. The epoxy resin to be used is not particularly limited, and a conventional epoxy resin which is commonly used as a main chain of a negative photosensitive resin, for example, an epoxy resin as disclosed in e.g. WO 2010/013816, may be used.

Further, the alkali-soluble resin (AP) is preferably one having an acid value of from 10 to 300 mgKOH/g, particularly preferably one having an acid value of from 30 to 150 mgKOH/g. Further, the number average molecular weight (Mn) is preferably at least 500 and less than 20,000, particularly preferably at least 2,000 and less than 15,000. The mass-average molecular weight (Mw) is preferably at least 1,000 and less than 40,000, particularly preferably at least 3,000 and less than 20,000.

Here, in this specification, the number average molecular weight (Mn) and mass average molecular weight (Mw), are those measured by a gel permeation chromatography method using polystyrene as the standard substance, unless otherwise specified.

As the alkali-soluble resin (AP), it is preferred to use the resin (A-2), from such a viewpoint that it is thereby possible to prevent peeling of the cured film during development, so that it is possible to obtain a pattern with high resolution dots, linearity of the pattern is good when the dots are linear, and smooth surface of the cured film can easily be obtainable.

As the alkali-soluble monomer (AM), for example, a monomer (A-3) having an acidic group and an ethylenic double bond is preferably used. The acidic group and ethylenic double bond are the same as of the alkali-soluble resin (AP). Also with respect to the acid value of the alkali-soluble monomer (AM), the same range as of the alkali-soluble resin (AP) is preferred.

The monomer (A-3) may, for example, be 2,2,2-triacryloyloxymethyl ethyl phthalate.

As the alkali-soluble resin or alkali soluble monomer (A) to be contained in the negative photosensitive resin composition, one type may be used alone, or two or more types may be used in combination.

The content of the alkali-soluble resin or alkali-soluble monomer (A) in the total solid content in the negative photosensitive resin composition is preferably from 5 to 80 mass %, particularly preferably from 30 to 70 mass %. When the content is within the above range, the photocuring properties and developability of the negative photosensitive resin composition will be good.

(Photopolymerization Initiator (B))

The photopolymerization initiator (B) in the present invention is not particularly limited so long as it is a compound having a function as a photopolymerization initiator, and a compound that generates radicals by light is preferred.

As the photopolymerization initiator (B), various compounds may be mentioned, which are classified into e.g. α-diketones, acyloins, acyloin ethers, thioxanthones, benzophenones, acetophenones, quinones, aminobenzoic acids, peroxides, oxime esters, fatty amines, etc.

Among such photopolymerization initiators (B), benzophenones, aminobenzoic acids and aliphatic amines are preferred, since they may exhibit sensitizing effects when used together with other radical initiators.

The photopolymerization initiator (B) is preferably 2-methyl-1-[4-(methylthio) phenyl]-2-morpholinopropan-1-one, or 2-benzyl-2-dimethylamino-1-(4-morpholinophenyl)-butan-1-one, classified into an acetophenone, 1,2-octane-dione 1-[4-(phenylthio)-2-(O-benzoyl oxime), or ethanone 1-[9-ethyl-6-(2-methylbenzoyl)-9H-carbazol-3-yl]-1-(O-acetyloxime), classified into an oxime ester, or 2,4-diethyl thioxanthone classified into a thioxanthone. Further, a combination thereof with a benzophenone such as 4,4'-bis(diethylamino)benzophenone, is particularly preferred.

One type of such photopolymerization initiators (B) may be used alone, or two or more types thereof may be used in combination.

The content of the photopolymerization initiator (B) in the total solid content of the negative photosensitive resin composition is preferably from 0.1 to 50 mass %, more preferably from 0.5 to 30 mass %, particularly preferably from 5 to 15 mass %. When the content is within the above range, the photocuring properties and developability of the negative photosensitive resin composition will be good.

(Ink Repellent Agent (C))

The ink repellent agent (C) in the present invention, has a fluorine atom content of from 1 to 45 mass % and is a partially hydrolyzed condensate of a hydrolyzable silane compound mixture containing a hydrolyzable silane compound (s1) having a hydrolyzable group and a $C_{2-40}$ monovalent group represented by $R^{f1}OR^{f2}$— (where $R^{f1}$ is a $C_{1-6}$ polyfluoroalkyl group, and $R^{f2}$ is a polyfluoroalkylene group which may have an etheric oxygen atom between carbon-carbon atoms, provided that, $R^{f1}OR^{f2}$— has at least one —O—$CF_2$— group).

The ink repellent agent (C) has ink repellency and a nature (upward migration nature) to migrate to the upper surface during the process of forming a cured film using the negative photosensitive resin composition containing it. By using the ink repellent agent (C), an upper layer portion including the upper surface of the obtainable cured film, becomes a layer where the ink repellent agent (C) is present densely (hereinafter referred to also as "ink-repellent layer"), and ink repellency is imparted to the upper surface of the cured film. The ink repellent agent (C) is a partially hydrolyzed condensate of a hydrolyzable silane compound mixture, and in the mixture, a hydrolyzable silane compound (s1) having an organic group having a polyfluoroalkylene group containing an etheric oxygen atom, is contained so that the fluorine atom content in the partially hydrolyzed condensate will be from 1 to 45 mass %, whereby it is possible to impart, to the upper surface of the cured film, ink repellency, i.e a nature to make the static contact angle high and the dynamic contact angle low, to the ink. Among ink-repellent properties, the ink repellent agent (C) is capable of imparting, in particular, a nature to lower the dynamic contact angle i.e. high ink-dropping properties to the upper surface of the cured film.

The content of fluorine atoms in the ink repellent agent (C) is from 1 to 45 mass %. When the content of fluorine atoms in the ink repellent agent (C) is at least the lower limit value in the above range, it is possible to impart good ink repellency, in particular good ink-dropping properties, to the upper surface of the cured film, and when it is at most the upper limit value, the compatibility with other components in the negative photosensitive resin composition becomes good. The content of fluorine atoms in the ink repellent agent (C), is more preferably at least 1.5 mass %, particularly preferably at least 2 mass %, with a view to imparting ink repellency. Here, if the content of fluorine atoms in the ink repellent agent (C) is high, there may be a case where the storage stability of the negative photosensitive resin composition lowers. Therefore, the content of fluorine atoms in the ink repellent agent (C) is more preferably at most 25 mass %, particularly preferably less than 10 mass %. That is, the content of fluorine atoms in the ink repellent agent (C) is particularly preferably at least 2 mass % and less than 10 mass %.

The ink repellent agent (C) is a partially hydrolyzed condensate of a hydrolyzable silane compound mixture (hereinafter referred to also as "mixture (M)"). The mixture (M) contains said hydrolyzable silane compound (s1) as an essential component and may optionally contain hydrolyzable silane compounds other than the hydrolyzable silane compound (s1). As the hydrolyzable silane compounds which may be optionally contained in the mixture (M), the following hydrolyzable silane compounds (s2) to (s5) may be mentioned.

As a hydrolyzable silane compound which may be optionally contained in the mixture (M), the hydrolyzable silane compound (s2) is particularly preferred, which acts as a component to enhance the film-forming property after the ink repellent (C) has migrated to the upper surface, in the production of a cured film by curing the negative photosensitive resin composition. Further, the hydrolyzable silane compound (s3) is also preferably used, which acts as a component to improve the fixability of the ink-repellent agent (C) in the ink-repellent layer i.e. in the upper layer portion of the cured film obtained by curing the negative photosensitive resin composition.

Hydrolyzable silane compound (s2): a hydrolyzable silane compound having four hydrolyzable groups bonded to a silicon atom.

Hydrolyzable silane compound (s3): a hydrolyzable silane compound having a hydrolyzable group and a group having an ethylenic double bond, and containing no fluorine atom.

Hydrolyzable silane compound (s4): a hydrolyzable silane compound having only a hydrocarbon group and a hydrolyzable group as groups bonded to a silicon atom (excluding one which is contained in the hydrolyzable silane compound (s3)).

Hydrolyzable silane compound (s5): a hydrolyzable silane compound having a mercapto group and a hydrolyzable group, and containing no fluorine atom.

As the hydrolyzable silane compounds (s1) to (s5), it is also possible to use, in addition to monomers classified in the respective hydrolyzable silane compounds, a partially hydrolyzed condensate (oligomer) which is obtained by preliminarily subjecting a plurality of them to partial hydrolysis condensation.

In the following, the hydrolyzable silane compounds (s1) to (s5) will be described.

<1> Hydrolyzable Silane Compound (s1)

The hydrolyzable silane compound (s1) is a compound having a hydrolyzable group and a $C_{2-40}$ monovalent group represented by $R^{f1}OR^{f2}$— (where $R^{f1}$ is a $C_{1-6}$ polyfluoroalkyl group, and $R^{f2}$ is a polyfluoroalkylene group which may have an etheric oxygen atom between carbon-carbon atoms). By the use of the hydrolyzable silane compound (s1), the ink repellent agent (C) has fluorine atoms and has excellent upward migration nature and ink repellency, particularly ink-dropping properties.

Here, $R^{f1}OR^{f2}$— has at least one —O—$CF_2$— group. The oxygen atom in the —O—$CF_2$— group is an ether oxygen atom, and the other bond of the oxygen atom is bonded to a carbon atom. The carbon atom bonded to the left hand side bond (the bond of the oxygen atom) of the group represented by —O—$CF_2$— may be a carbon atom having two fluorine atoms bonded thereto (i.e. $CF_2$), or a carbon atom having at least one atom other than a fluorine atom bonded thereto, such as $CH_2$. Specifically, for example, —$CF_2$—O—$CF_2$—, $CF_3$—O—$CF_2$—, —$CH_2$—O—$CF_2$—, —$CF(CF_3)$—O—$CF_2$—, etc. are groups having a —O—$CF_2$— group.

Here, a —O—$CF_2$— group is a group equal to a —$CF_2$—O— group, i.e. the same group, except that only the expression (the order of atoms) in the chemical formula is different. Thus, for example, —$CF_2$—O—$CH_2$—, —$CF_2$—O—$CF(CF_3)$—, $CF_3$—O—$CH_2$—, etc. are also groups having a —O—$CF_2$— group.

As the hydrolyzable group, an alkoxy group, a halogen atom, an acyl group, an isocyanate group, an amino group, and a group having at least one hydrogen of an amino group substituted by an alkyl group, may be mentioned. A $C_{1-4}$ alkoxy group and a halogen atom are preferred; a methoxy group, an ethoxy group and a chlorine atom are more preferred; and a methoxy group and an ethoxy group are particularly preferred, from such a viewpoint that reactions for forming hydroxy groups (silanol groups) by a hydrolysis reaction and further forming Si—O—Si bonds by an intermolecular condensation reaction, tend to proceed smoothly.

As the hydrolyzable silane compound (s1), one type may be used alone, or two or more types may be used in combination.

As the hydrolyzable silane compound (s1), a compound represented by the following formula (cx-1) is preferred.

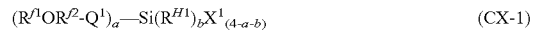

(CX-1)

In the formula (cx-1), each symbol is as follows.

$Q^1$ is a $C_{1-10}$ divalent organic group containing no fluorine atom.

$R^{H1}$ is a $C_{1-6}$ monovalent hydrocarbon group.

a is 1 or 2, and b is 0 or 1, provided that a+b is 1 or 2.

$X^1$ is a hydrolyzable group.

When a plurality of $X^1$ are present, they may be the same or different from each other.

When a plurality of $R^{f1}OR^{f2}$-$Q^1$ are present, they may be the same or different from each other.

The compound (cx-1) is a fluorinated hydrolyzable silane compound having one bifunctional or trifunctional hydrolyzable silyl group.

$R^{H1}$ is preferably a $C_{1-3}$ hydrocarbon group, and a methyl group is particularly preferred.

In the formula (cx-1), more preferably a is 1 and b is 0 or 1, and particularly preferably b is 0.

Specific examples and preferred embodiments of $X^1$ are as described above for hydrolyzable groups.

$R^{f1}$ is preferably a $C_{1-6}$ perfluoroalkyl group. The number of carbon atoms in $R^{f1}$ is preferably from 1 to 4, more preferably from 1 to 3. The structure of $R^{f1}$ may be a straight chain structure, a branched structure, a cyclic structure and a partially ring structure, and a straight chain structure is preferred. As $R^{f1}$, a $C_{1-3}$ straight chain perfluoroalkyl group is particularly preferred.

$R^{f2}$ may specifically be a group represented by the following formula (1).

—[(CY$_2$—O)$_{n1}$(CY$_2$CY$_2$—O)$_{n2}$(CY$_2$CY$_2$CY$_2$—O)$_{n3}$
(CY$_2$CY$_2$CY$_2$CY$_2$—O)$_{n4}$]—(CY$_2$)$_{n5}$—  (1)

In the formula (1), each symbol is as follows.

Y each independently is H, F or CF$_3$, and in each repeating unit enclosed in n1, n2, n3, n4 or n5, at least one Y is F or CF$_3$.

n1, n2, n3 and n4 are each independently an integer of 0 or more, provided that n1+n2+n3+n4 is at least 1. n5 is an integer of from 1 to 4.

Total number of carbon atoms in the formula (1) is the number to be from 2 to 40 in total with R$^{f1}$.

The order of presence of the repeating units enclosed n1, n2, n3 and n4 is not limited in the formula (1).

In the formula (1), (CY$_2$)$_{n5}$ is a linear or branched polyfluoroalkylene group, and a perfluoroalkylene group wherein all of Y are F or CF$_3$, is preferred. CF(CF$_3$)(CF$_2$)$_{n6}$ (where n6 is an integer represented by n5-1, preferably 0 or 1) or (CF$_2$)$_{n5}$ (where n5 is the same integer as described above, preferably 1 or 2) is particularly preferred.

As R$^{f2}$, a perfluoroalkylene group containing an etheric oxygen atom, wherein all of Y in the formula (1) are F or CF$_3$, is preferred.

The number of carbon atoms in R$^{f2}$ is the number to be from 2 to 40 in total with R$^{f1}$. Such number of carbon atoms is preferably from 2 to 20, particularly preferably from 2 to 10.

When R$^{f2}$ is within the above exemplified groups, the ink repellent agent (C) will have excellent ink repellency, particularly ink-dropping properties, and the compound (cx-1) will be excellent in solubility in a solvent.

Specific examples of R$^{f2}$ include the following groups.
—(CF$_2$O)$_{n1}$—(CY$_2$)$_{n5}$—,
—(CF$_2$CF$_2$O)$_{n2}$—(CY$_2$)$_{n5}$—,
—{CF(CF$_3$)CF$_2$O}$_{n2}$—(CY$_2$)$_{n5}$—,
—(CF$_2$CF$_2$CF$_2$O)$_{n3}$—(CY$_2$)$_{n5}$—,
—[(CF$_2$O)$_{n1}$—(CF$_2$CF$_2$O)$_{n2}$]—(CY$_2$)$_{n5}$—,
—[(CF$_2$O)$_{n1}$—{CF$_2$CF(CF$_3$)O}$_{n2}$]—(CY$_2$)$_{n5}$—,
—[(CF$_2$O)$_{n1}$—{CF(CF$_3$)CF$_2$O}$_{n2}$]—(CY$_2$)$_{n5}$—,
—[(CF$_2$CF$_2$O)$_{n2}$—{CF(CF$_3$)CF$_2$O}$_{n2}$]—(CY$_2$)$_{n5}$—,
—[(CF$_2$CF$_2$O)$_{n2}$—(CF$_2$CF$_2$CF$_2$O)$_{n4}$]—(CY$_2$)$_{n5}$—,
—[(CF$_2$CF$_2$CF$_2$O)$_{n3}$—{CF(CF$_3$)CF$_2$O}$_{n2}$]—(CY$_2$)$_{n5}$—.

(In the above formulae, n1 to n5 and Y have, independently in each formula, the same meanings as in the above formula (1), and preferred embodiments are also the same.)

Among these, as R$^{f2}$, the following groups are preferred.
—CF$_2$CF$_2$O—CF$_2$—,
—CF$_2$CF$_2$O—CF$_2$CF$_2$—,
—(CF$_2$CF$_2$O)$_2$—CF$_2$—,
—(CF$_2$CF$_2$O)$_2$—CF$_2$CF$_2$—,
—(CF$_2$CF$_2$O)$_4$—CF$_2$—,
—(CF$_2$CF$_2$O)$_4$—CF$_2$CF$_2$—,
—CF$_2$CF$_2$CF$_2$O—CF$_2$—,
—CF$_2$CF$_2$CF$_2$O—CF$_2$CF$_2$—,
—CF$_2$CF$_2$CF$_2$O—CF(CF$_3$)—,
—CF$_2$CF$_2$CF$_2$O—CF(CF$_3$)CF$_2$—,
—CF$_2$O—CF(CF$_3$)CF$_2$O—CF(CF$_3$)—,
—CF$_2$CF$_2$O—CF(CF$_3$)CF$_2$O—CF(CF$_3$)—,
—CF$_2$CF$_2$CF$_2$O—CF(CF$_3$)CF$_2$O—CF$_2$CF$_2$—,
—CF$_2$CF$_2$CF$_2$O—CF(CF$_3$)CF$_2$O—CF(CF$_3$)—,
—CF$_2$CF$_2$CF$_2$O—CF(CF$_3$)CF$_2$O—CF(CF$_3$)CF$_2$—,
—CF(CF$_3$)CF$_2$O—CF$_2$CF$_2$—,
—CF(CF$_3$)CF$_2$O—CF(CF$_3$)—,
—CF(CF$_3$)CF$_2$O—CF(CF$_3$)CF$_2$—.

In the formula (cx-1), Q$^1$ is a C$_{1-10}$ divalent organic group containing no fluorine atom.

As Q$^1$, when represented so that Si is bonded to the bond on the right hand side and R$^{f2}$ is bonded to the bond on the left hand side, for example, a group represented by —(CH$_2$)$_{i1}$-A-(CH$_2$)$_{i2}$— (where A is a single bond, an amide bond, a urethane bond, a sulfonamide bond, an ether bond or an ester bond, i1 and i2 are each independently an integer of from 0 to 10, and the number of carbon atoms in the entire group is from 1 to 10) may be mentioned.

As Q$^1$, the following groups are preferred.
—(CH$_2$)$_{i1}$—,
—CH$_2$O(CH$_2$)$_{i2}$—,
—O(CH$_2$)$_{i2}$—,
—SO$_2$NR$^1$—(CH$_2$)$_{i2}$—,
—(C=O)—NR$^1$—(CH$_2$)$_{i2}$—,
—(CH$_2$)$_{i1}$—O—C(=O)—NR$^1$—(CH$_2$)$_{i2}$—,
—(CH$_2$)$_{i1}$—O—C(=O)—(CH$_2$)$_{i2}$—,
—(CH$_2$)$_{i1}$—C(=O)—O—(CH$_2$)$_{i2}$—.

(In each group, i1 is an integer of from 1 to 5, i2 is an integer of from 1 to 4, R$^1$ is a hydrogen atom, a methyl group or an ethyl group, and the number of carbon atoms in the entire group is from 1 to 10. The number of carbon atoms in the entire group is preferably from 1 to 5.)

Hereinafter, —C(=O)N . . . will be shown as —CON . . . For example, —C(=O)NH— will be shown as —CONH—. Likewise, —O—C(=O) . . . will be shown as —OCO . . . , and —C(=O)—O . . . will be shown as —COO . . . .

As Q$^1$, —(CH$_2$)$_{i1}$—, —O(CH$_2$)$_{i2}$— and —CONH(CH$_2$)$_{i2}$— (where i1 and i2 are as defined above including the preferred embodiments) are particularly preferred. Here, i1 and i2 are each independently more preferably from 1 to 3, particularly preferably 2 or 3.

Specific examples of the compound (cx-1) include the following compounds.
CF$_3$CF$_2$O(CF$_2$CF$_2$O)(CF$_2$O(CH$_2$Si(OCH$_3$)$_3$,
CF$_3$CF$_2$O(CF$_2$CF$_2$O)(CF$_2$)CONH(CH$_2$)$_3$Si(OCH$_3$)$_3$,
CF$_3$CF$_2$CF$_2$O(CF(CF$_3$)CF$_2$O)(CF$_2$)$_2$(CH$_2$)$_2$Si(OCH$_3$)$_3$,
CF$_3$CF$_2$O(CF$_2$CF$_2$O)(CF$_2$)$_2$(CH$_2$)$_2$Si(OCH$_3$)$_3$,
CF$_3$CF$_2$CF$_2$O(CF(CF$_3$)CF$_2$O)(CF(CF$_3$))CONH(CH$_2$)$_3$Si (OCH$_3$)$_3$,
CF$_3$CF$_2$CF$_2$O(CF(CF$_3$)CF$_2$O)(CF(CF$_3$)CF$_2$)O(CH$_2$Si (OCH$_3$)$_3$,
CF$_3$CF$_2$CF$_2$O(CF$_2$CF$_2$CF$_2$O)$_2$CONH(CH$_2$)$_3$Si(OCH$_3$)$_3$ In the present invention, as the compound (cx-1),
CF$_3$CF$_2$O(CF$_2$CF$_2$O)(CF$_2$)$_2$O(CH$_2$)$_2$Si(OCH$_3$)$_3$,
CF$_3$CF$_2$O(CF$_2$CF$_2$O)(CF$_2$)CONH(CH$_2$)$_3$Si(OCH$_3$)$_3$,
CF$_3$CF$_2$CF$_2$O(CF(CF$_3$)CF$_2$O)(CF(CF$_3$))CONH(CH$_2$)$_3$Si (OCH$_3$)$_3$,
CF$_3$CF$_2$CF$_2$O(CF(CF$_3$)CF$_2$O)(CF(CF$_3$)CF$_2$)O(CH$_2$)$_3$Si (OCH$_3$)$_3$ or
CF$_3$CF$_2$O(CF$_2$CF$_2$CF$_2$O)(CF$_2$)$_2$CONH(CH$_2$)$_3$Si (OCH$_3$)$_3$ is particularly preferred.

The above compound (cx-1) can be prepared by a known method, for example, by the method disclosed in WO2009/008380.

The content of the hydrolyzable silane compound (s1) in the mixture (M) is such a proportion that the content of fluorine atoms in the partially hydrolyzed condensate obtained from the mixture would be from 1 to 45 mass %, more preferably from 1.5 to 25 mass %, particularly preferably at least 2 mass % and less than 10 mass %. When the content of the hydrolyzable silane compound (s1) is at least the lower limit value in the above range, it is possible to impart good ink repellency, particularly good ink-dropping properties, to the upper surface of the cured film, and when it is at most the upper limit value, the compatibility with other hydrolyzable silane compounds in the mixture will be good, and the storage stability in the photosensitive resin composition will be less likely to be low.

<2> Hydrolyzable Silane Compound (s2)

By incorporating the hydrolyzable silane compound (s2) to the mixture (M) in the present invention, in a cured film obtainable by curing the negative photosensitive resin composition containing the ink repellent agent (C), it is possible to increase the film-forming property after the ink repellent agent (C) has migrated to the upper surface. That is, the number of hydrolyzable groups in the hydrolyzable silane compound (s2) is large, and it is considered that after migration to the upper surface, the ink-repellent agent (C) will be well condensed to one another to form a thin film over the entire upper surface to constitute an ink repellent layer.

Further, by incorporating the hydrolyzable silane compound (s2) to the mixture (M), the ink repellent agent (C) becomes easily dissolvable in a hydrocarbon type solvent.

As the hydrolyzable silane compound (s2), one type may be used alone, or two or more types may be used in combination.

As the hydrolyzable groups, it is possible to use the same ones as the hydrolyzable groups of the hydrolyzable silane compound (s1).

The hydrolyzable silane compound (s2) can be represented by the following formula (cx-2). The hydrolyzable silane compound (s2) may be an oligomer of the compound (cx-2).

$$SiX^2{}_4 \qquad (cx\text{-}2)$$

In the formula (cx-2), $X^2$ represents a hydrolyzable group, the four $X^2$ may be the same or different from one another. As $X^2$, the same group as the above $X^1$ may be used.

As the hydrolyzable silane compound (s2), specifically the following compounds may be mentioned.

$Si(OCH_3)_4$, $Si(OC_2H_5)_4$, a partially hydrolyzed condensate of $Si(OCH_3)_4$ (e.g. Methyl Silicate 51 (trade name), manufactured by Colcoat Co., Ltd.), a partially hydrolyzed condensate of $Si(OC_2H_5)_4$ (e.g. Ethyl Silicate 40, Ethyl Silicate 48 (trade name), manufactured by Colcoat Co., Ltd.).

The content of the hydrolyzable silane compound (s2) in the mixture (M) is preferably from 1 to 25 moles, particularly preferably from 3 to 20 moles, to 1 mole of the hydrolyzable silane compound (s1). When the content is at least the lower limit value in the above range, the film-forming property of the ink repellent agent (C) will be good, and when it is at most the upper limit value, the ink repellency of the ink repellent agent (C) will be good.

<3> Hydrolyzable Silane Compound (s3)

By incorporating the hydrolyzable silane compound (s3) to the mixture (M) in the present invention, it is possible to obtain an ink repellent agent (C) having a group with an ethylenic double bond in a side chain, as a partially hydrolyzed condensate of the mixture (M). The ink repellent agent (C) is thereby preferable in that via the group with an ethylenic double bond, the ink repellent agent (C) can be polymerized by itself, or the ink repellent agent (C) and another component having an ethylenic double bond contained in the negative photosensitive resin composition can be (co)polymerized. As a result, it is possible to obtain an effect to increase the fixing properties of the ink repellent agent (C) in the ink-repellent layer.

As the hydrolyzable silane compound (s3), one type may be used alone, or two or more types may be used in combination.

As the hydrolyzable groups, the same ones as the hydrolyzable groups of the hydrolyzable silane compound (s1) may be used.

As the group having an ethylenic double bond, a (meth)acryloyloxy group and a vinylphenyl group are preferred, and a (meth)acryloyloxy group is particularly preferred.

As the hydrolyzable silane compound (s3), a compound represented by the following formula (cx-3) is preferred.

$$(Z\text{-}Q^3)_g\text{---}Si(R^{H3})_h X^3{}_{(4-g-h)} \qquad (cx\text{-}3)$$

The symbols in the formula (cx-3) are as follows.

Z is a group having an ethylenic double bond.

$Q^3$ is a $C_{1-6}$ divalent organic group containing no fluorine atom.

$R^{H3}$ is a $C_{1-6}$ monovalent hydrocarbon group.

$X^3$ is a hydrolyzable group.

g is 1 or 2, and h is 0 or 1, provided that g+h is 1 or 2.

In a case where a plurality of $Z\text{-}Q^3$ are present, they may be the same or different from one another.

In a case where a plurality of $X^3$ are present, they may be the same or different from one another.

As $R^{H3}$, specifically, the same group as the above $R^{H1}$ is used.

As $X^3$, specifically, the same group as the above $X^1$ is used.

As Z, a (meth)acryloyloxy group and a vinylphenyl group are preferred, and a (meth)acryloyloxy group is particularly preferred.

Specific examples of $Q^3$ may be a $C_{2-6}$ alkylene group and a phenylene group. Among them, —$(CH_2)_3$— is preferred.

It is preferred that g is 1, and h is 0 or 1.

As the compound (cx-3), one type may be used alone, or two or more types may be used in combination.

Specific examples of the compound (cx-3) include the following compounds.

$CH_2\!\!=\!\!C(CH_3)COO(CH_2)_3Si(OCH_3)_3$,
$CH_2\!\!=\!\!C(CH_3)COO(CH_2)_3Si(OC_2H_5)_3$,
$CH_2\!\!=\!\!CHCOO(CH_2)_3Si(OCH_3)_3$,
$CH_2\!\!=\!\!CHCOO(CH_2)_3Si(OC_2H_5)_3$,
$[CH_2\!\!=\!\!C(CH_3)COO(CH_2)_3]CH_3Si(OCH_3)_2$,
$[CH_2\!\!=\!\!C(CH_3)COO(CH_2)_3]CH_3Si(OC_2H_5)_2$.

The content of the hydrolyzable silane compound (s3) in the mixture (M) is preferably from 0.1 to 25 moles, particularly preferably from 0.5 to 20 moles, to 1 mole of the hydrolyzable silane compound (s1). When the content is at least the lower limit value in the above range, migration of the ink repellent agent (C) to the upper surface will be good, and the fixing properties of the ink repellent agent (C) will be good in the ink repellent layer including the upper surface after migration to the upper surface, and further, the storage stability of the ink repellent agent (C) will be good. When it is at most the upper limit value, the ink repellency of the ink repellent agent (C) will be good.

<4> Hydrolyzable Silane Compound (s4)

When the hydrolyzable silane compound (s2) is used in the mixture (M) of the invention, partition walls formed by curing the negative photosensitive resin composition, may sometimes have swelling at ends of their upper surface. This swelling is very fine at a level observable by e.g. a scanning electron microscope (SEM). The present inventors have confirmed that, at such swelling, the content of F and/or Si is larger than at other portions.

Such swelling is not particularly influential over partition walls, etc., however, the present inventors have found it possible to prevent formation of such swelling by replacing part of the hydrolyzable silane compound (s2) with the hydrolyzable silane compound (s4) having a smaller number of hydrolyzable groups.

By a reaction among silanol groups formed by the hydrolyzable silane compound (s2) having a large number of hydrolyzable groups, the film-forming property of the ink repellent agent (C) will be increased. However, the swelling is considered to occur, since the reactivity is high. And, by replacing part of the hydrolyzable silane compound (s2) with the hydrolyzable silane compound (s4) having a small number of hydrolyzable groups, it is considered possible to prevent the reaction among silanol groups, thereby to prevent formation of the swelling.

As the hydrolyzable silane compound (s4), one type may be used alone, or two or more types may be used in combination.

As the hydrolyzable groups, the same ones as the hydrolyzable groups of the hydrolyzable silane compound (s1) may be used.

As the hydrolyzable silane compound (s4), a compound represented by the following formula (cx-4) is preferred.

$$(R^{H4})_j\text{—}SiX^4_{(4-j)} \quad (\text{cx-4})$$

In the formula (cx-4), each symbol is as follows.
$R^{H4}$ is a $C_{1-20}$ hydrocarbon group.
$X^4$ is a hydrolyzable group.
j is an integer of from 1 to 3, preferably 2 or 3.
In a case where a plurality of $R^{H4}$ are present, they may be the same or different from each other.
In a case where a plurality of $X^4$ are present, they may be the same or different from each other.

As $R^{H4}$, when j is 1, a $C_{1-20}$ aliphatic hydrocarbon group or a $C_{6-10}$ aromatic hydrocarbon group may be mentioned, and a $C_{1-10}$ alkyl group or a phenyl group is, for example, preferred. When j is 2 or 3, $R^{H4}$ is preferably a $C_{1-6}$ hydrocarbon group, more preferably a $C_{1-3}$ hydrocarbon group.

As $X^4$, the same group as the above $X^1$ is used, including the preferred embodiments.

Specific examples of the compound (cx-4) include the following compounds. Here, Ph in the formula represents a phenyl group.

$(CH_3)_3\text{—}Si\text{—}OCH_3$, $(CH_3CH_2)_3\text{—}Si\text{—}OC_2H_5$, $(CH_3)_3\text{—}Si\text{—}OC_2H_5$, $(CH_3CH_2)_3\text{—}Si\text{—}OCH_3$, $(CH_3)_2\text{—}Si\text{—}(OCH_3)_2$, $(CH_3)_2\text{—}Si\text{—}(OC_2H_5)_2$, $(CH_3CH_2)_2\text{—}Si\text{—}(OC_2H_5)_2$, $(CH_3CH_2)_2\text{—}Si\text{—}(OCH_3)_2$, $Ph\text{-}Si(OC_2H_5)_3$, $C_{10}H_{21}\text{—}Si(OCH_3)_3$.

The content of the hydrolyzable silane compound (s4) in the mixture (M) is preferably from 0.05 to 10 moles, particularly preferably from 0.3 to 5 moles, to 1 mole of the hydrolyzable silane compound (s1). When the content is at least the lower limit value in the above range, it is possible to prevent swelling at the ends of the upper surface of partition walls. When it is at most the upper limit value, the ink repellency of the ink repellent agent (C) will be good.

<5> Hydrolyzable Silane Compound (s5)

By incorporating the hydrolyzable silane compound (s5) to the mixture (M) of the present invention, the obtainable negative photosensitive resin composition becomes curable at a relatively low exposure dose, and it becomes possible to efficiently conduct the production of a cured film. It is considered that a mercapto group in the hydrolyzable silane compound (s5) has a chain transfer property, whereby in a case where the alkali-soluble resin or alkali-soluble monomer (A) or the ink repellent agent (C) has an ethylenic double bond, the mercapto group tends to be readily bonded to such an ethylenic double bond, thereby to accelerate the photo-curing.

Further, the hydrolyzable silane compound (s5) containing a mercapto group has a pKa of about 10 and thus is likely to be deprotonated, i.e. dissociated, in an alkaline solution. Here, $pKa=-\log_{10}Ka$, wherein Ka is an acid dissociation constant. Therefore, the mercapto group is considered to increase the alkali-solubility at the time of development of the negative photosensitive resin composition.

As the hydrolyzable silane compound (s5), one type may be used alone, or two or more types may be used in combination.

As the hydrolyzable groups, the same ones as the hydrolyzable groups of the hydrolyzable silane compound (s1) may be used.

As the hydrolyzable silane compound (s5), a compound represented by the following formula (cx-5) is preferred.

$$(HS\text{-}Q^5)_p\text{—}Si(R^{H5})_qX^5_{(4-p-q)} \quad (\text{cx-5})$$

In the formula (cx-5), each symbol is as follows.
$Q^5$ is a $C_{1-10}$ divalent organic group containing no fluorine atom.
$R^{H5}$ is a $C_{1-6}$ hydrocarbon group.
$X^5$ is a hydrolyzable group.
p is 1 or 2, and q is 0 or 1, provided that p+q is 1 or 2.
In a case where a plurality of $HS\text{-}Q^5$ are present, they may be the same or different from each other.
In a case where a plurality of $X^5$ are present, they may be the same or different from each other.

As $X^5$, specifically the same group as the above $X^1$ is used.

$Q^5$ is preferably a $C_{1-10}$ alkylene group, more preferably a $C_{1-5}$ alkylene group, particularly preferably a $C_{1-3}$ alkylene group.

As $R^{H5}$, specifically the same group as the above $R^{H1}$ is used.

Specific examples of the compound (cx-5) include HS—$(CH_2)_3$—$Si(OCH_3)_3$, HS—$(CH_2)_3$—$Si(CH_3)(OCH_3)_2$, etc.

The content of the hydrolyzable silane compound (s5) in the mixture (M) is preferably from 0.1 to 15 moles, particularly preferably from 0.1 to 10 moles, to 1 mole of the hydrolyzable silane compound (s1). When the content is at least the lower limit value in the above range, curing at a lower amount of exposure, i.e. efficient curing, becomes possible with the negative photosensitive resin composition. Further, developability becomes good with improved alkali solubility. When it is at most the upper limit value, the ink repellency of the ink repellent agent (C) will be good.

<6> Other Hydrolyzable Silane Compounds

The mixture (M) may optionally contain one or more hydrolyzable silane compounds other than the hydrolyzable silane compounds (s1) to (s5), as the case requires within a range not to impair the effects of the present invention.

As such other hydrolyzable silane compound, a hydrolyzable silane compound having an alkylene oxide group and a hydrolyzable group and containing no fluorine atom, may be mentioned. Specifically, for example, $CH_3O(C_2H_4O)_kSi(OCH_3)_3$ (a polyoxyethylene group-containing trimethoxysilane) (where k is, for example, about 10), may be mentioned. Further, as a hydrolyzable silane compound containing fluorine atoms, other than the hydrolyzable silane compound (s1), for example, $R^f Si(OCH_3)_3$ (where $R^f$ is a polyfluoroalkyl group) may be mentioned.

<7> Ink Repellent Agent (C)

The ink repellent agent (C) is a partially hydrolyzed condensate of the mixture (M). As an example of the ink repellent agent (C), an average composition formula of ink repellent agent (C11) being a partially hydrolyzed condensate of the mixture (M) containing a compound (cx-1) and optionally containing compounds (cx-2) to (cx-5), is shown by the following formulas (II):

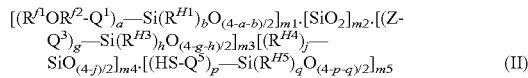

$$[(R^{f1}OR^{f2}-Q^1)_a-Si(R^{H1})_bO_{(4-a-b)/2}]_{m1} \cdot [SiO_2]_{m2} \cdot [(Z-Q^3)_g-Si(R^{H3})_hO_{(4-g-h)/2}]_{m3}[(R^{H4})_f-SiO_{(4-f)/2}]_{m4} \cdot [(HS-Q^5)_p-Si(R^{H5})_qO_{(4-p-q)/2}]_{m5} \quad (II)$$

In the formula (II), m1 to m5 represent mole fractions of the respective structural units to the total molar amount of constituent units. m1>0, m2≥0, m3≥0, m4≥0, m5≥0, and m1+m2+m3+m4+m5=1. Other respective symbols are as defined above.

Here, the ink repellent agent (C11) is, actually, a formed product (partially hydrolyzed condensate) wherein hydrolyzable groups or silanol groups are remained, and therefore, it is difficult to have such a formed product represented by a chemical formula. The average composition formula represented by the formula (II) is a chemical formula in the case where all of hydrolyzable groups or silanol groups are assumed to have been converted to siloxane bonds in the ink repellent agent (C11). Further, in the formula (II), units derived from the respective compounds (cx-1) to (cx-5), are assumed to be randomly arranged. Further, for example, in a case where in place of the compound (cx-2), its oligomer is used, as compared to a case where the compound (cx-2) is used, randomness in the arrangement of units derived from the compound (cx-2) is assumed to decrease.

In the average composition formula represented by the formula (II), m1:m2:m3:m4:m5 coincides with the composition of the compounds (cx-1) to (cx-5) charged in the mixture (M).

The molar ratios of the respective components are designed from the balance of the effects of the respective components.

m1 is preferably from 0.02 to 0.4, in such an amount that the content of fluorine atoms in the ink repellent agent (C11) becomes within the above-mentioned preferred range.

m2 is preferably from 0 to 0.98, particularly preferably from 0.05 to 0.7.

m3 is preferably from 0 to 0.8, particularly preferably from 0.2 to 0.7.

m4 is preferably from 0 to 0.5, and when m4 is not 0, particularly preferably from 0.05 to 0.3.

m5 is preferably from 0 to 0.9, and when m5 is not 0, more preferably 0.05 to 0.8, particularly preferably from 0.05 to 0.4.

Further, the above preferred molar ratios of the respective components are similarly applicable even in a case where the mixture (M) contains the hydrolyzable silane compound (s1) and optionally contains the hydrolyzable silane compounds (s2) to (s5). That is, the preferred amounts of the hydrolyzable silane compounds (s1) to (s5) charged in the mixture (M) to obtain an ink repellent agent (C) correspond, respectively, to the above preferred ranges of m1 to m5.

The mass average molecular weight (Mw) of the ink repellent agent (C) is preferably at least 500, and preferably less than 1,000,000, particularly preferably less than 10,000.

When the mass average molecular weight (Mw) is at least the lower limit value, the ink repellent agent (C) tends to migrate easily to the upper surface at the time of forming a cured film using the negative photosensitive resin composition. When it is less than the upper limit value, solubility of the ink repellent agent (C) in a solvent will be good.

The mass average molecular weight (Mw) of the ink repellent agent (C) can be adjusted by the production conditions.

The ink repellent agent (C) can be prepared by subjecting the above mixture (M) to hydrolysis and condensation reaction by a known method.

For this reaction, it is preferred to use, as a catalyst, an inorganic acid such as hydrochloric acid, sulfuric acid, nitric acid or phosphoric acid, or an organic acid such as acetic acid, oxalic acid or maleic acid, which is commonly employed.

For the above reaction, a known solvent may be used.

The ink repellent agent (C) obtained by the above reaction may be blended into the negative photosensitive resin composition in the form of a solution together with a solvent.

The content of the ink repellent agent (C) in the total solid content in the negative photosensitive resin composition is preferably from 0.01 to 15 mass %, more preferably from 0.01 to 5 mass %, particularly preferably from 0.03 to 1.5 mass %. When the content is at least the lower limit value in the above range, the upper surface of a cured film to be formed from the negative photosensitive resin composition will have excellent ink repellency, particularly excellent ink-dropping properties. When it is at most the upper limit value in the above range, the adhesion between the cured film and the substrate will be good. Further, the negative photosensitive resin composition will be excellent in storage stability.

(Cross-linking Agent (D))

A cross-linking agent (D) to be optionally contained in the negative photosensitive resin composition of the present invention is a compound having at least two ethylenic double bonds in one molecule and having no acidic group. When the negative photosensitive resin composition contains the cross-linking agent (D), curability of the negative photosensitive resin composition at the time of exposure will be improved, whereby it is possible to efficiently form a cured film.

As the cross-linking agent (D), diethylene glycol di(meth) acrylate, trimethylolpropane tri(meth)acrylate, pentaerythritol tri(meth)acrylate, pentaerythritol tetra(meth)acrylate, ditrimethylolpropane tetra(meth)acrylate, dipentaerythritol penta(meth)acrylate, dipentaerythritol hexa(meth)acrylate, ethoxylated isocyanuric acid tri(meth)acrylate, a tri(meth) acrylate of ε-caprolactone-modified tris(2-hydroxyethyl) isocyanurate, and urethane acrylate, may, for example, be mentioned.

From the viewpoint of photoreactivity, it is preferred to have many ethylenic double bonds. For example, pentaerythritol tetra(meth)acrylate, ditrimethylolpropane tetra (meth)acrylate, dipentaerythritol hexa(meth)acrylate, dipentaerythritol penta(meth)acrylate, ethoxylated isocyanuric acid tri(meth)acrylate and urethane acrylate are preferred.

As the cross-linking agent (D), one type may be used alone, or two or more types may be used in combination.

The content of the cross-linking agent (D) in the total solid content of the negative photosensitive resin composition is preferably from 20 to 70 mass %, particularly preferably from 30 to 70 mass %.

(Solvent (E))

When the negative photosensitive resin composition of the present invention contains a solvent (E), its viscosity is reduced, whereby it becomes easy to apply the negative photosensitive resin composition to the substrate surface. As a result, it becomes possible to form a coating film of the negative photosensitive resin composition having a uniform thickness.

Known solvents may be used as the solvent (E). As the solvent (E), one type may be used alone, or two or more types may be used in combination.

As the solvent (F), alkylene glycol alkyl ethers, alkylene glycol alkyl ether acetates, alcohols, solvent naphtha, etc. may be exemplified. Among them, at least one solvent selected from the group consisting of alkylene glycol alkyl ethers, alkylene glycol alkyl ether acetates, and alcohols, is preferred, and at least one solvent selected from the group consisting of propylene glycol monomethyl ether acetate, propylene glycol monomethyl ether, diethylene glycol ethyl methyl ether and 2-propanol, is more preferred.

The content of the solvent (E) in the negative photosensitive resin composition is preferably from 50 to 99 mass %, more preferably from 60 to 95 mass %, particularly preferably from 65 to 90 mass %, to the total amount of the composition.

(Coloring Agent (F))

The negative photosensitive resin composition of the present invention may contain a coloring agent (F), depending on the application, in the case of imparting a light-shielding property to a cured film, especially to partition walls. As the coloring agent (F) in the present invention, carbon black, azo black pigment, azomethine black pigment, aniline black, anthraquinone black pigment and perylene black pigment, specifically, C. I. Pigment Black 1, 6, 7, 12, 20, 31, etc. may be mentioned. It is also possible to use a mixture of organic pigments and/or inorganic pigments, such as a red pigment, a blue pigment and a green pigment.

As the coloring agent (F), one type may be used alone, or two or more types may be used in combination. In a case where the negative photosensitive resin composition of the present invention contains a coloring agent (F), the content of the coloring agent (F) in the total solid content is preferably from 15 to 65 mass %, particularly preferably from 20 to 50 mass %. Within the above range, the negative photosensitive resin composition thereby obtainable will be good in the sensitivity, and the partition walls to be thereby formed will be excellent in light-shielding property.

(Other Components)

The negative photosensitive resin composition of the present invention may further contain, as the case requires, one or more of other additives including e.g. thermal cross-linking agents, polymer dispersing agents, dispersing aids, silane coupling agents, fine particles, phosphoric acid compounds, curing accelerators, thickeners, plasticizers, anti-foaming agents, leveling agents, cissing inhibitors and ultra-violet absorbers.

The negative photosensitive resin composition of the present invention is obtainable by mixing predetermined amounts of the above-described respective components.

The negative photosensitive resin composition of the present invention has good storage stability. Further, by using the negative photosensitive resin composition of the present invention, it is possible to produce a cured film, particularly partition walls, having good ink repellency, particularly excellent ink-dropping properties, on the upper surface. Further, by suitably using, during the production of the ink repellent agent (C), in addition to the hydrolyzable silane compound (s1) as an essential component, the hydrolyzable silane compound (s2), or (s3), (s4) or (s5), it is possible to efficiently firmly fix the ink repellent agent (C) to the ink repellent layer.

[Cured Resin Film and Partition Walls in Second Embodiment]

A cured resin film in the second embodiment of the present invention is formed by using the above negative photosensitive resin composition of the present invention. The cured resin film in the second embodiment of the present invention is obtainable, for example, by applying the negative photosensitive resin composition of the present invention to the surface of a substrate such as a base plate, followed by drying in a case where the negative photosensitive resin composition of the present invention contains a solvent (E), to remove the solvent (E), and then by exposure for cuing. The cured resin film to be formed on a substrate by using the negative photosensitive resin composition of the present invention is a cured resin film within the scope of the cured resin film in the first embodiment of the present invention, having the above-mentioned characteristics (I), (II) and (III), as the characteristics at the surface and the interior, in the composition analyses using XPS.

The partition walls of the present invention are partition walls made of the above-described cured film of the present invention, which is formed in a form to partition the substrate surface into a plurality of compartments for dot formation. The partition walls are obtainable, for example, in such a manner that in the above preparation of a cured resin film, portions to become compartments for dot formation are masked before exposure, followed by exposure and then by development. By the development, the portions unexposed by masking, will be removed, whereby opening sections corresponding to the compartments for dot formation will be formed together with partition walls.

Now, an example of a method for producing partition walls in the embodiment of the present invention will be described with reference to FIGS. 2A to 2D, but the production method of partition walls is not limited to the following. Here, the following production method will be described as one wherein the negative photosensitive resin composition contains a solvent (E).

Figure 2A:
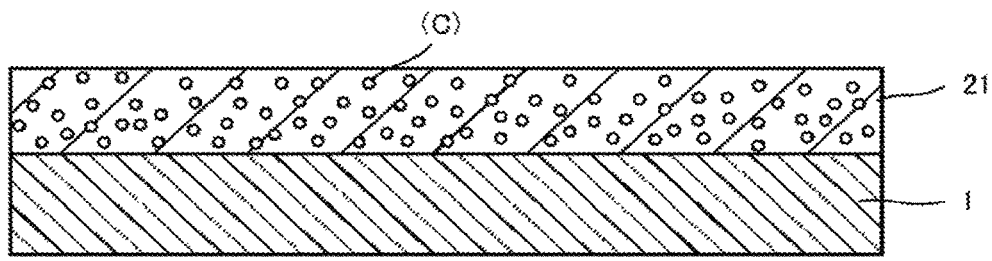
FIG. 2A is a process chart schematically illustrating a method for producing partition walls in an embodiment of the present invention.

As shown in FIG. 2A, the negative photosensitive resin composition is applied over the entire main surface on one side of a substrate 1 to form a coating film 21. At that time, in the coating film 21, the ink repellent agent (C) is wholly dissolved and uniformly dispersed. Here, in FIG. 2A, the ink repellent agent (C) is shown schematically, and actually, it is not present in the form of such particles.

Figure 2B:
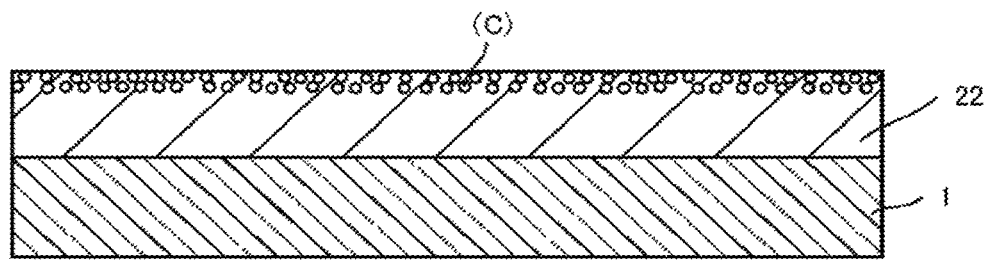
FIG. 2B is a process chart schematically illustrating a method for producing partition walls in an embodiment of the present invention.

Then, as shown in FIG. 2B, the coating film 21 is dried to obtain a dried film 22. As the drying method, heat drying, vacuum drying and vacuum heat drying may, for example, be mentioned. In the case of heat drying, the heating temperature is preferably from 50 to 120° C., although it may depend on the type of the solvent (E).

During this drying process, the ink repellent agent (C) will migrate to the upper layer portion of the dried film. Here, even in a case where the negative photosensitive resin composition contains no solvent (E), the upward migration of the ink repellent agent (C) in the coating film will be likewise accomplished.

Figure 2C:
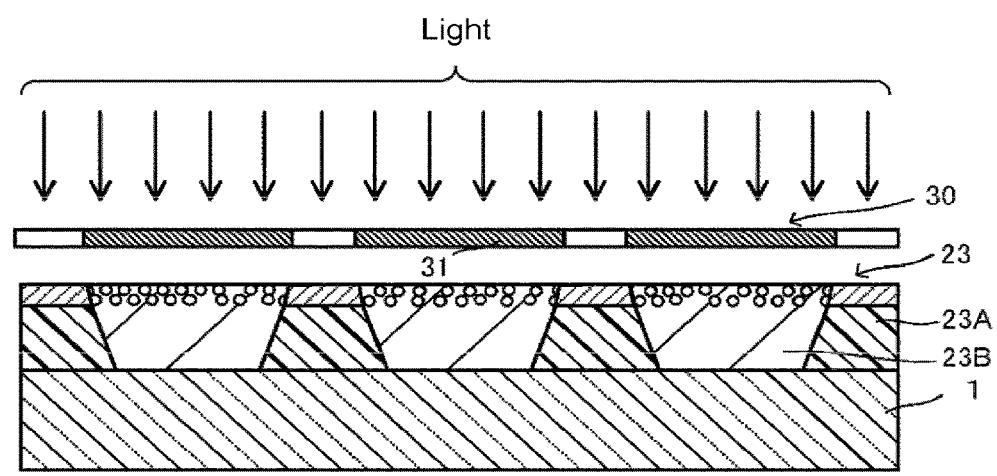
FIG. 2C is a process chart schematically illustrating a method for producing partition walls in an embodiment of the present invention.

Then, as shown in FIG. 2C, light is applied to the dried film 22 for exposure via a photomask 30 having masking portions 31 in a form corresponding to opening sections partitioned by partition walls. The film after the exposure of the dried film 22 will be referred to as an exposed film 23. In the exposed film 23, the exposed portions 23A are photocured, and the non-exposed portions 23B are in the same state as the dried film 22.

The light for irradiation may, for example, be visible light; ultraviolet light; far-ultraviolet light; excimer laser light, such as KrF excimer laser light, ArF excimer laser light, $F_2$ excimer laser light, $Kr_2$ excimer laser light, KrAr excimer laser light or $Ar_2$ excimer laser light; X-rays; electron rays; etc.

The light for irradiation is preferably light with a wavelength of from 100 to 600 nm, and more preferably light with a wavelength of from 300 to 500 nm, particularly preferably light including i-line (365 nm), h-line (405 nm) or g-line (436 nm). Further, as the case requires, light of 330 nm or less may be cut.

The exposure method may, for example, be entire surface collective exposure or scanning exposure. The same portion may be exposed plural times. In such a case, exposure conditions for the plural times may be the same or may not be the same.

In any of the above exposure methods, the exposure amount is, for example, preferably from 5 to 1,000 mJ/cm$^2$, more preferably from 5 to 500 mJ/cm$^2$, further preferably from 5 to 300 mJ/cm$^2$. Here, the exposure amount is suitably optimized depending upon e.g. the wavelength of light for irradiation, the composition of the negative photosensitive resin composition and the thickness of the coating film.

The exposure time per unit area is not particularly limited and may be designed from e.g. the exposure power of the exposure apparatus to be used and the required exposure amount. Here, in the case of scanning exposure, the exposure time may be determined from the scanning speed of light.

The exposure time per unit area is usually from about 1 to 60 seconds.

Figure 2D:
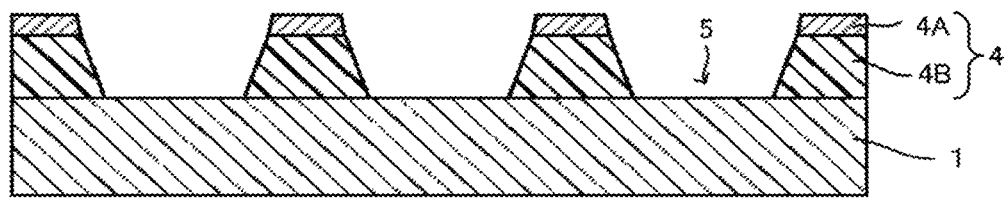
FIG. 2D is a process chart schematically illustrating a method for producing partition walls in an embodiment of the present invention.

Then, as shown in FIG. 2D, development is carried out by using an alkaline developer, to form partition walls 4 made solely of portions corresponding to the exposed portions 23A of the exposed film 23. Opening sections 5 partitioned by partition walls 4 are areas where non-exposed portions 23B were present in the exposed film 23, and FIG. 2D shows the state after the non-exposed portions 23B have been removed by development. The non-exposed portions 23B are dissolved and removed by the alkaline developer in such a state that, as described above, the ink repellent agent (C) has migrated to the upper layer portion so that the ink repellent agent (C) is no longer substantially present in a layer below it, and therefore, the ink repellent agent (C) does not substantially remain in the opening sections 5.

Here, in the partition walls 4 as shown in FIG. 2D, the uppermost layer including the upper surface is an ink-repellent layer 4A. In a case where the ink repellent agent (C) does not have a side chain with an ethylenic double bond, i.e., in the case of an ink repellent agent (C) obtainable from the mixture (M) not containing the hydrolyzable silane compound (s3), the ink repellent agent (C) remains in the uppermost layer at a high concentration to form an ink repellent layer at the time of exposure. At the time of exposure, the alkali-soluble resin or alkali soluble monomer (A) and further other photocurable components optionally contained, present in the vicinity of the ink repellent agent (C), are firmly photocured, whereby the ink repellent agent (C) is fixed to the ink-repellent layer.

In a case where the ink repellent agent (C) has a side chain containing an ethylenic double bond, i.e. in the case of an ink repellent agent (C) obtainable from the mixture (M) containing the hydrolyzable silane compound (s3), the ink repellent agent (C) is photo-cured to one another and/or together with the alkali-soluble resin or alkali-soluble monomer (A), or other photocurable components, to form an ink repellent layer 4A in which the ink repellent agent (C) is firmly bonded.

In each of the above cases, in the lower side of the ink repellent layer 4A, a layer 4B containing substantially no ink repellent agent (C) is formed by photo-curing of mainly the alkali-soluble resin or alkali-soluble monomer (A) and other photocurable components optionally contained.

Thus, the ink repellent agent (C) is sufficiently fixed to partition walls including the ink repellent layer 4A and the lower layer 4B thereof, and accordingly it is less likely to migrate to the opening sections at the time of development.

After the development, the partition walls 4 may further be heated. The heating temperature is preferably from 130 to 250° C. By the heating, curing of the partition walls will be further strengthened. Therefore, the heating is preferred. Further, the ink repellent agent (C) will be more firmly fixed in the ink repellent layer 4A.

The cured resin film and the partition walls 4 of the present invention thus obtained, are made of a partially hydrolyzed condensate obtainable from a mixture (M) wherein the ink repellent agent (C) contains the hydrolyzable silane compound (s1), and thus have good ink repellency, particularly excellent ink-dropping properties on the upper surface. Further, in the partition walls 4, after the development, there is substantially no ink repellent agent (C) present in the opening sections 5, whereby it is possible to sufficiently secure uniform coatability of ink at the opening sections 5.

Further, for the purpose of certainly securing the ink affinity of the opening sections 5, after the heating, an ultraviolet/ozone treatment, an oxygen plasma treatment or an argon plasma treatment may be applied in order to remove the development residue, etc. of the negative photosensitive resin composition which may be present in the opening sections 5.

The partition walls to be formed from the negative photosensitive resin composition of the present invention have, for example, a width of preferably at most 100 μm, particularly preferably at most 20 μm. Further, the distance (the width of the pattern) between adjacent partition walls is preferably at most 300 μm, particularly preferably at most 100 μm. The height of the partition walls is preferably from 0.05 to 50 μm, particularly preferably from 0.2 to 10 μm.

At the time of carrying out pattern printing by an IJ method, the partition walls of the present invention are useful as partition walls to define the opening sections to be ink injection regions. If the partition walls of the present invention are formed and used so that the opening sections correspond to desired ink injection regions at the time of carrying out pattern printing by an IJ method, since the upper surface of the partition walls has good ink repellency, particularly excellent ink-dropping properties, it is possible to prevent the ink from being injected beyond the partition walls to undesired opening sections i.e. ink injection areas. Further, the opening sections defined by the partition walls have good wet-spreadability of ink, whereby it becomes possible to uniformly print the ink at the desired regions without white spots, etc.

By using the partition walls of the present invention, as mentioned above, pattern printing by an IJ method can be elaborately carried out. Thus, the partition walls of the present invention are useful as partition walls of an optical element having partition walls located between a plurality of dots and their adjacent dots on a substrate surface, on which the dots are formed by an IJ method.

[Optical Element]

The optical element of the present invention is an optical element having the partition walls of the present invention located between a plurality of dots and their adjacent dots on a substrate surface. In the optical element of the present invention, the dots are preferably formed by an IJ method.

Now, an optical element in an embodiment of the present invention will be described with reference to a case where it is produced by an IJ method. However, the method for producing the optical element of the present invention is not limited to the following one.

Figure 3A:
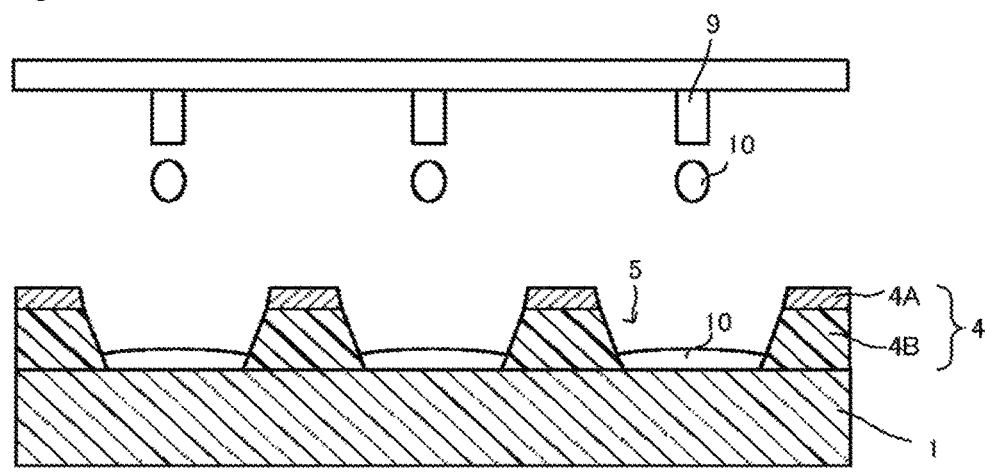
FIG. 3A is a process chart schematically illustrating a method for producing an optical element in an embodiment of the present invention.
Figure 3B:
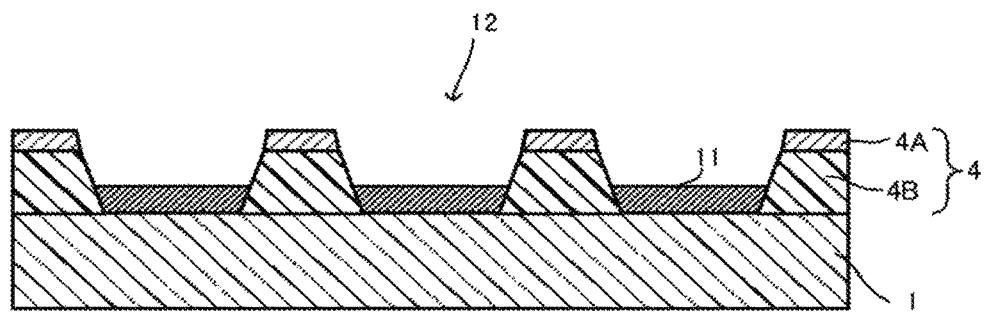
FIG. 3B is a process chart schematically illustrating a method for producing an optical element in an embodiment of the present invention.

FIGS. 3A to 3B schematically illustrate a method for producing an optical element by using the partition walls 4 formed on a substrate 1 as shown in the above-described FIG. 2D. Here, the partition walls 4 formed on a substrate 1 are ones formed so that opening sections 5 would agree to the pattern of dots of the optical element to be produced.

As shown in FIG. 3A, an ink 10 is dropped from an ink jet head 9 into opening sections 5 defined by partition walls 4 so that a predetermined amount of the ink 10 is injected into the opening sections 5. As the ink, an ink known for an optical element is suitably selected for use to meet the functions of dots.

Then, depending upon the type of the ink 10 used, for example, for removal of a solvent, or for curing, treatment such as drying and/or heating, etc. may be applied to obtain, as shown in FIG. 3B, an optical element 12 having desired dots 11 formed in a form being adjacent to the partition walls 4.

By using the partition walls of the present invention, in the process for producing the optical element of the present invention, for example, if the ink jet head 9 has dropped an ink slightly off from the center of opening sections, so that the ink has been supplied on the upper surface of the partition walls, the ink tends to readily drop from the upper surface of partition walls into the opening sections. Further, by using the partition walls of the present invention, it is possible to let the ink wet-spread uniformly without unevenness in opening sections partitioned by the partition walls, and thus, the optical element will have dots formed with high precision.

As the optical element, an organic EL element, a color filter and TFT array element of a liquid crystal element, a quantum dot display, a thin-film solar cell, etc. may be mentioned.

The TFT array element is an element wherein a plurality of dots are arranged in a planar view matrix form, and each dot is provided with image electrodes and TFT as a switching element to drive them.

The TFT array element is used as a TFT array substrate for e.g. an organic EL element or a liquid crystal element.

The TFT array may be produced, for example, as follows but not limited thereto.

A gate electrode of e.g. aluminum or its alloy is film-deposited on a transparent substrate of e.g. glass. This gate electrode may be patterned as the case requires.

Then, a gate insulating film of e.g. silicon nitride is formed by e.g. a plasma CVD method. A source electrode and a drain electrode may be formed on the gate insulating film. The source electrode and the drain electrode may be prepared, for example, by forming a metal thin film of e.g. aluminum, gold, silver, copper, or an alloy thereof, by vacuum deposition or sputtering. As a method of patterning the source electrode and the drain electrode, a method may be mentioned wherein after forming the metal thin film, a resist is applied, followed by exposure and development to let the resist remain at portions where the electrodes are desired to be formed, and then, the exposed metal is removed by e.g. phosphoric acid or aqua regia, and finally the resist is removed. Otherwise, in a case where a metal thin film of e.g. gold is formed, a method is available wherein a resist is preliminarily applied, followed by exposure and development to let the resist remain at portions where the electrodes are not desired to be formed, and then the metal thin film is formed, followed by removal of the photoresist together with the metal thin film. Otherwise, the source electrode and the drain electrode may be formed by a method such as ink-jet or the like using e.g. a metal nano-colloid of e.g. silver or copper.

Then, by using the composition of the present invention, partition walls are formed in a planar view lattice form along outlines of respective dots, by a photolithography method including coating, exposure and development.

Then, a semiconductor solution is applied into dots by an IJ method, followed by drying the solution to form a semiconductor layer. As such a semiconductor solution, an organic semiconductor solution, or an inorganic coating-type oxide semiconductor solution may be used. A source electrode and a drain electrode may be formed after formation of this semiconductor layer, by using a method such as ink-jet.

Finally, a transparent electrode of e.g. ITO is film-deposited by e.g. sputtering, and a protective film of e.g. silicon nitride is formed by film deposition.

The organic EL element may be produced, for example, as follows.

On a light transmitting substrate of e.g. glass, a light transmitting electrode of e.g. tin-doped indium oxide (ITO) is deposited by e.g. a sputtering method. As the case requires, this light transmitting electrode may be subjected to patterning.

Then, using the negative photosensitive resin composition of the present invention, partition walls are formed in a planar view lattice form along outlines of respective dots, by a photolithography method including coating, exposure and development.

Then, into the dots, by an IJ method, materials for a hole injection layer, a hole transport layer, a luminescent layer, a hole blocking layer and an electron injection layer are respectively applied and dried to sequentially laminate these layers. The types and number of organic layers to be formed in the dots are suitably designed.

Finally, a reflecting electrode of e.g. aluminum is formed by e.g. a vapor deposition method.

The quantum dot display may be produced, for example, as follows but not limited thereto.

By using the composition of the present invention, partition walls are formed in a planar view lattice form along outlines of respective dots on a light-transmitting substrate of e.g. glass.

Then, into the dots, by an IJ method, a nanoparticle solution to convert blue light to green light, a nanoparticle solution to convert blue light to red light, and, as the case requires, a blue color ink, are applied and dried, to from a module. By using a blue-emitting light source as a backlight, and using the above module as a substitute for a color filter, it is possible to obtain a liquid crystal display excellent in color reproducibility.

EXAMPLES

Now, the present invention will be described with reference to Examples, but it should be understood that the present invention is by no means thereby limited. Ex. 1 to 10 are Examples of the present invention, and Ex. 11 and 12 are Comparative Examples.

The respective measurements were conducted by the following methods.

[Number Average Molecular Weight (Mn), Mass Average Molecular Weight (Mw)]

A number average molecular weight (Mn) and a mass average molecular weight (Mw) were measured by a gel permeation chromatography method using polystyrene as the standard substance. As gel permeation chromatography, HPLC-8220GPC (manufactured by Tosoh Corporation) was used. As the column, one having three columns of shodex LF-604 connected, was used. As the detector, a RI detector was used. As the standard substance, EasiCal PS1 (manufactured by Polymer Laboratories Ltd.) was used. Further, at the time of measuring a number average molecular weight and a mass average molecular weight, the column was held at 37° C., tetrahydrofuran was used as an eluent, the flow rate was adjusted to be 0.2 mL/min., and 40 µL of a 0.5 mass % tetrahydrofuran solution of a sample to be measured, was injected.

[Content of Fluorine Atoms (Mass %)]

The content of fluorine atoms was calculated by $^{19}$F NMR measurement using 1,4-bis(trifluoromethyl)benzene as the standard substance.

[Content of Ethylenic Double Bonds (C=C) (mmol/g)]

The content of ethylenic double bonds was calculated from the blend proportions of raw materials.

Abbreviations of compounds used in the following Examples are shown below.

(Alkali-soluble Resin (AP))

Alkali-soluble resin (A1) composition: A composition (solid content: 70 mass %, PGMEA: 30 mass %) of a resin (alkali-soluble resin (A1), acid value: 60 mgKOH/g, number average molecular weight (Mn): 2,800, mass average molecular weight (Mw): 7,800) obtained by purifying with hexane a resin having acryloyl groups and carboxy groups introduced by reacting a cresol novolac-type epoxy resin with acrylic acid and then with 1,2,3,6-tetrahydrophthalic anhydride.

Alkali-soluble resin (A2) composition: A composition (solid content: 70 mass %, PGMEA: 30 mass %) of a resin (alkali-soluble resin (A2), acid value: 60 mgKOH/g, number average molecular weight (Mn): 1,900, mass average molecular weight (Mw): 3,300) obtained by purifying with hexane a resin having acryloyl groups and carboxy groups introduced by reacting a biphenyl-type epoxy resin with acrylic acid and then with 1,2,3,6-tetrahydrophthalic anhydride.

Alkali-soluble resin (A3) composition: A composition (solid content: 70 mass %, PGMEA: 30 mass %) of a resin (alkali-soluble resin (A3), acid value: 60 mgKOH/g, number average molecular weight (Mn): 3,100, mass average molecular weight (Mw): 8,200) obtained by purifying with hexane a resin having acryloyl groups and carboxy groups introduced by reacting a bisphenol A-type epoxy resin with acrylic acid and then with 1,2,3,6-tetrahydro phthalic anhydride.

(Photopolymerization Initiator (B))

IR907: IRGACURE 907 (trade name, manufactured by BASF), 2-methyl-1-[4-(methylthio)phenyl]-2-morpholinopropan-1-one EAB: 4,4'-bis(diethylamino)benzophenone (manufactured by Tokyo Chemical Industry Co., Ltd)

(Raw Materials for Ink Repellent Agent (C))

Compound (cx-11) corresponding to compound (cx-1): $CF_3CF_2CF_2O(CF(CF_3)CF_2O)(CF(CF_3))CONH(CH_2)_3Si(OCH_3)_3$ (produced in the following Synthesis Example 1).

Compound (cx-12) corresponding to compound (cx-1): $CF_3CF_2CF_2O(CF(CF_3)CF_2O)(CF(CF_3)CF_2)O(CH_2)_3Si(OCH_3)_3$ (produced in the following Synthesis Example 2)

Compound (cx-13) corresponding to compound (cx-1): $CF_3CF_2O(CF_2CF_2O)(CF_2)CONH(CH_2)_3Si(OCH_3)_3$ (produced in the following Synthesis Example 3)

Compound (cx-14) corresponding to compound (cx-1): $CF_3CF_2O(CF_2CF_2O)(CF_2)_2O(CH_2)_3Si(OCH_3)_3$ (produced in the following Synthesis Examples 4)

Compound (cx-15) corresponding to compound (cx-1): $CF_3CF_2CF_2O(CF_2CF_2CF_2O)(CF_2)_2CONH(CH_2)_3Si(OCH_3)_3$ (produced in the following Synthesis Example 5)

Comparative compound (cf-1): $F(CF_2)_6CH_2CH_2Si(OCH_3)_3$ (produced by a known method).

Compound (cx-21) corresponding to compound (cx-2): $Si(OC_2H_5)_4$ (manufactured by Colcoat Co., Ltd.).

Compound (cx-31) corresponding to compound (cx-3): $CH_2=CHCOO(CH_2)_3Si(OCH_3)_3$ (KBM-5103: trade name, manufactured by Shin-Etsu Chemical Co., Ltd.).

Compound (cx-41) corresponding to compound (cx-4): $(CH_3)_3-Si-OCH_3$ (manufactured by Tokyo Kasei Kogyo Co., Ltd.).

Compound (cx-51) corresponding to compound (cx-5): $HS-(CH_2)_3-Si(OCH_3)_3$ (KBM-803: trade name, manufactured by Shin-Etsu Chemical Co., Ltd.).

(Cross-Linking Agent (D))

DPHA: DPHA, trade name, manufactured by Daicel-Cytec Co., dipentaerythritol hexaacrylate (Solvent (E))

PGMEA: propylene glycol monomethyl ether acetate

PGME: propylene glycol monomethyl ether

IPA: 2-propanol

[Raw Materials for Ink Repellent Agent (C) and Synthesis of Ink Repellent Agent (C)]

Ink repellent hydrolyzable silane compounds (cx-11) to (cx-15) as raw materials for ink repellent agent (C) were synthesized as follows, and then, ink repellent agents (C1) to (C12) were synthesized.

Synthesis Example 1

Synthesis of Compound (cx-11)

A 100 mL eggplant flask equipped with a dropping funnel and having a stirrer chip put therein, was thoroughly purged with nitrogen. Then, 14.3 g of $CF_3CF_2CF_2OCF(CF_3)CF_2OCF(CF_3)COF$ and 17.2 g of NaF were added to the eggplant flask and stirred at room temperature in a nitrogen atmosphere. Then, 7.4 g of methanol was dropwise added, and the mixture was reacted at room temperature for 3 hours. Then, it was filtered through a membrane filter with a 0.5 µm pore size to obtain 19.8 g of a reaction crude liquid. Then, 18.0 g of this reaction crude liquid was put in a 50 mL eggplant flask equipped with a dropping funnel and having a stirrer chip put therein and stirred at room temperature. 5.3 g of 3-aminopropyltrimethoxysilane was dropwise added, and the mixture was reacted at room temperature for 3 hours. After completion of the reaction, the reaction crude liquid was purified by distillation to obtain 10 g of $CF_3CF_2CF_2O(CF(CF_3)CF_2O)(CF(CF_3))CONH(CH_2)_3Si(OCH_3)_3$ (compound (cx-11)).

Synthesis Example 2

Synthesis of Compound (cx-12)

A 200 ml eggplant flask having a stirrer chip put therein, was thoroughly purged with nitrogen. Then, 119.7 g of tetraglyme, 35.8 g of $CF_3CF_2CF_2OCF(CF_3)CF_2OCF(CF_3)COF$ and 16.4 g of CsF were added to the eggplant flask and then stirred at 50° C. for one hour in a nitrogen atmosphere. While maintaining the temperature at 50° C., 13.0 g of allyl bromide was dropwise added. The temperature was raised to 80° C., and the mixture was reacted for 12 hours in a nitrogen atmosphere. After completion of the reaction, extraction and washing with water were conducted, whereupon the organic phase after two-layer separation was recovered. To the organic phase, a 5% sodium hydroxide aqueous solution was added, followed by stirring for 30 minutes, whereupon the organic phase after two-layer separation was recovered. The recovered organic phase was purified by distillation to obtain 17.9 g of precursor 1 ($CF_3CF_2CF_2OCF(CF_3)CF_2OCF(CF_3)CF_2OCH_2CH=CH_2$).

In a 100 mL eggplant flask having a stirrer chip put therein, 16.0 g of the above obtained precursor 1 ($CF_3CF_2CF_2OCF(CF_3)CF_2OCF(CF_3)CF_2OCH_2CH=CH_2$), 0.07 g of a solution of platinum/1,3-divinyl-1,1,3,3-tetramethyldisiloxane complex in xylene (platinum content: 2%) and 15.93 g of trichlorosilane were put and reacted at 60° C. for 5 hours. After completion of the reaction, the reaction crude liquid was purified by distillation, to obtain 14.1 g of precursor 2 ($CF_3CF_2CF_2OCF(CF_3)CF_2OCF(CF_3)CF_2OCH_2CH_2CH_2SiCl_3$).

In a 100 mL eggplant flask equipped with a dropping funnel and having a stirrer chip put therein, 13.0 g of the above-obtained precursor 2 ($CF_3CF_2CF_2OCF(CF_3)CF_2OCF(CF_3)CF_2OCH_2CH_2CH_2SiCl_3$) was put and stirred at room temperature. 18.7 g of trimethyl orthoformate and 0.2 g of methanol were dropwise added and reacted at 60° C. for 3 hours. After completion of the reaction, the reaction crude liquid was purified by distillation to obtain 9.3 g of $CF_3CF_2CF_2OCF(CF_3)CF_2OCF(CF_3)CF_2OCH_2CH_2CH_2Si(OCH_3)_3$ (compound (cx-12)).

Synthesis Example 3

Synthesis of Compound (cx-13)

9.7 g of $CF_3CF_2O(CF_2CF_2O)(CF_2)CONH(CH_2)_3Si(OCH_3)_3$ (compound (cx-13)) was obtained in the same manner as in Synthesis Example 1, except that $CF_3CF_2CF_2OCF(CF_3)CF_2OCF(CF_3)COF$ was changed to 10.0 g of $CF_3CF_2OCF_3CF_2OCF_2COF$.

Synthesis Example 4

Synthesis of Compound (cx-14)

8.8 g of $CF_3CF_2O(CF_2CF_2O)(CF_2)_2O(CH_2)_3Si(OCH_3)_3$ (Compound (cx-14)) was obtained in the same manner as in Synthesis Example 2, except that $CF_3CF_2CF_2OCF(CF_3)CF_2OCF(CF_3)COF$ was changed to 25.3 g of $CF_3CF_2OCF_3CF_2OCF_2COF$.

Synthesis Example 5

Synthesis of Compound (Cx-15)

9.8 g of $CF_3CF_2CF_2O(CF_2CF_2CF_2O)(CF_2)_2CONH(CH_2)_3Si(OCH_3)_3$ (compound (cx-15)) was obtained in the same manner as in Synthesis Example 2 except that $CF_3CF_2CF_2OCF(CF_3)CF_2OCF(CF_3)COF$ was changed to 34.6 g of $CF_3CF_2CF_2OCF_2CF_2CF_2OCF_2CF_2COF$.

Synthesis Example 6

Synthesis of Ink Repellent Agent (C1)

In a 300 cm$^3$ three-necked flask equipped with a stirrer, 1.67 g of compound (cx-11), 7.86 g of compound (cx-21) and 8.84 g of compound (cx-31) were put to obtain a hydrolyzable silane compound mixture. Then, 71.8 g of PGME was put to this mixture to prepare a raw material solution.

To the obtained raw material solution, 9.79 g of a 1% nitric acid aqueous solution was dropwise added. After completion of the dropwise addition, stirring was continued at 40° C. for 5 hours, to obtain a PGME solution of ink repellent agent (C1) (ink repellent (C1) concentration: 10 mass %, hereinafter referred to also as "ink repellent agent (C1) solution").

Further, after completion of the reaction, the components of the reaction solution were measured by using gas chromatography, to confirm that the respective compounds as starting materials were below the detection limits.

The charged amounts of raw material hydrolyzable silane compounds used in the production of the obtained ink repellent agent (C1) are shown in Table 2-1 and Table 2-2 (hereinafter, Table 2-1 and Table 2-2 may together be referred to as Table 2). In Table 2, silane compounds are meant for hydrolyzable silane compounds. Further, the measured results of the number average molecular weight (Mn), the mass average molecular weight (Mw), the content of fluorine atoms and the content of C=C, of the obtained ink repellent agent (C1) are also shown in Table 2.

Synthesis Examples 7 to 17

Syntheses of Ink Repellent Agents (C2) to (C12)

In the same manner as in Synthesis Example 6 except that the raw material composition was as shown in Table 2, i.e. PGME was added to a mixture of the respective silane compounds as shown in Table 2 to prepare a raw material solution, and the aqueous acid solution as shown in Table 2 was dropwise added thereto, followed by stirring as in Synthesis Example 6, to obtain a solution of each of ink repellent agents (C2) to (C12) (compound concentration in each solution: 10 mass %, hereinafter, each solution may be referred to as "ink repellent agent (C2) solution to ink repellent agent (C12) solution").

Here, the ink repellent agent (C11) solution and the ink repellent agent (C12) solution are ink-repellent agents outside the scope of the present invention, which were obtained by using a fluorinated hydrolyzable silane compound of comparative compound (cf-1) in place of the compound corresponding to compound (cx-1) in the raw material mixture.

The charged amounts and molar ratios of raw material hydrolyzable silane compounds used in the production of ink repellent agents (C2) to (C12) as obtained above, are shown in Table 2. In Table 2, silane compound is meant for a hydrolyzable silane compound. Further, the measured results of the number average molecular weight (Mn), the mass average molecular weight (Mw), the content of fluorine atoms and the content of C=C, of the obtained ink repellent agents are also shown in Table 2.

TABLE 2

| | | Synthesis Example | 6 | 7 | 8 | 9 | 10 | 11 |
|---|---|---|---|---|---|---|---|---|
| | | Ink repellent agent (C) | (C1) | (C2) | (C3) | (C4) | (C5) | (C6) |
| Charged amounts of silane compounds, etc. (g) | Silane compounds | Compound (cx-11) | 1.67 | — | 2.49 | 2.86 | 2.46 | — |
| | | Compound (cx-12) | — | 2.26 | — | — | — | 2.28 |
| | | Compound (cx-13) | — | — | — | — | — | — |
| | | Compound (cx-14) | — | — | — | — | — | — |
| | | Compound (cx-15) | — | — | — | — | — | — |
| | | Compound (cf-1) | — | — | — | — | — | — |
| | | Compound (cx-21) | 7.86 | 7.37 | 10.36 | 6.99 | 8.03 | 7.43 |
| | | Compound (cx-31) | 8.84 | 8.28 | — | 7.69 | 6.54 | 6.45 |
| | | Compound (cx-41) | — | — | 2.07 | — | 1.11 | — |
| | | Compound (cx-51) | — | — | 4.89 | — | — | 1.94 |
| | Solvent | PGME | 71.8 | 72.8 | 69.2 | 73.6 | 72.5 | 72.4 |
| | Acid | 1% nitric acid aqueous solution | 9.79 | 9.28 | 10.98 | 8.85 | 9.36 | 9.54 |
| | | 1% hydrochloric acid aqueous solution | — | — | — | — | — | — |
| Charged molar ratios of silane compounds | | Compound (cx-11) | 0.03 | — | 0.04 | 0.06 | 0.05 | — |
| | | Compound (cx-12) | — | 0.05 | — | — | — | 0.04 |
| | | Compound (cx-13) | — | — | — | — | — | — |
| | | Compound (cx-14) | — | — | — | — | — | — |
| | | Compound (cx-15) | — | — | — | — | — | — |
| | | Compound (cf-1) | — | — | — | — | — | — |
| | | Compound (cx-21) | 0.49 | 0.48 | 0.51 | 0.48 | 0.47 | 0.47 |
| | | Compound (cx-31) | 0.48 | 0.47 | — | 0.46 | 0.35 | 0.36 |
| | | Compound (cx-41) | — | — | 0.20 | — | 0.13 | — |
| | | Compound (cx-51) | — | — | 0.25 | — | — | 0.13 |
| Physical properties | | Mn | 1,020 | 910 | 1,080 | 870 | 1,030 | 850 |
| | | Mw | 1,090 | 980 | 1,120 | 950 | 1,150 | 920 |
| | | Content (wt %) of fluorine atoms | 8 | 12 | 12 | 14 | 12 | 12 |
| | | Content (mmol/g) of C=C | 3.8 | 3.5 | 0.0 | 3.3 | 2.8 | 2.8 |

| | | Synthesis Example | 12 | 13 | 14 | 15 | 16 | 17 |
|---|---|---|---|---|---|---|---|---|
| | | Ink repellent agent (C) | (C7) | (C8) | (C9) | (C10) | (C11) | (C12) |
| Charged amounts of silane compounds, etc. (g) | Silane compounds | Compound (cx-11) | — | — | — | — | — | — |
| | | Compound (cx-12) | 2.30 | — | — | — | — | — |
| | | Compound (cx-13) | — | 2.83 | — | — | — | — |
| | | Compound (cx-14) | — | — | 2.58 | — | — | — |
| | | Compound (cx-15) | — | — | — | 2.30 | — | — |
| | | Compound (cf-1) | — | — | — | — | 5.62 | 2.82 |
| | | Compound (cx-21) | 8.31 | 7.91 | 8.13 | 8.31 | 9.16 | 13.50 |
| | | Compound (cx-31) | 4.97 | 4.73 | 4.86 | 4.97 | 10.30 | 12.34 |
| | | Compound (cx-41) | 0.80 | 0.76 | 0.78 | 0.80 | — | — |
| | | Compound (cx-51) | 2.17 | 2.06 | 2.12 | 2.17 | — | — |
| | Solvent | PGME | 71.6 | 72.0 | 71.7 | 71.6 | 109.5 | 105.7 |
| | Acid | 1% nitric acid aqueous solution | 9.88 | 9.66 | 9.83 | 9.88 | 12.38 | 15.69 |
| | | 1% hydrochloric acid aqueous solution | — | — | — | — | — | — |
| Charged molar ratios of silane compounds | | Compound (cx-11) | — | — | — | — | — | — |
| | | Compound (cx-12) | 0.04 | — | — | — | — | — |
| | | Compound (cx-13) | — | 0.07 | — | — | — | — |
| | | Compound (cx-14) | — | — | 0.06 | — | — | — |
| | | Compound (cx-15) | — | — | — | 0.04 | — | — |
| | | Compound (cf-1) | — | — | — | — | 0.12 | 0.05 |
| | | Compound (cx-21) | 0.48 | 0.46 | 0.47 | 0.48 | 0.44 | 0.53 |
| | | Compound (cx-31) | 0.26 | 0.25 | 0.25 | 0.26 | 0.44 | 0.43 |
| | | Compound (cx-41) | 0.09 | 0.09 | 0.09 | 0.09 | — | — |
| | | Compound (cx-51) | 0.13 | 0.13 | 0.13 | 0.13 | — | — |
| Physical properties | | Mn | 940 | 1,050 | 980 | 1,120 | 950 | 890 |
| | | Mw | 990 | 1,120 | 1,010 | 1,210 | 1,000 | 940 |
| | | Content (wt %) of fluorine atoms | 12 | 12 | 12 | 12 | 20 | 10 |
| | | Content (mmol/g) of C=C | 2.1 | 2.0 | 2.1 | 2.1 | 3.0 | 3.5 |

[Ex. 1: Production of Negative Photosensitive Resin Composition, and Production of Partition Walls]

(Production of Negative Photosensitive Resin Composition)

12.66 g of the alkali-soluble resin (A1) composition, 1.12 g of IR907, 1.00 g of EAB, 1.61 g of ink repellent agent (C1) solution, 8.96 g of DPHA, 69.7 g of PGME and 5.0 g of IPA were put in a 200 cm$^3$ container for stirring, and stirred for 3 hours to produce a negative photosensitive resin composition 1.

(Production of Partition Walls)

A 10 cm square glass substrate was subjected to ultrasonic cleaning with ethanol for 30 seconds and then to UV/O$_3$ treatment for 5 minutes. For the UV/O$_3$ treatment, PL2001N-58 (manufactured by Sen Engineering Co., Ltd.) was used as an UV/O$_3$ generating apparatus. The light power (light output) calculated for 254 nm was 10 mW/cm$^2$.

On the surface of the glass substrate after the above cleaning, the negative photosensitive resin composition 1 obtained as described above, was applied by means of a spinner and then, dried on a hot plate at 100° C. for 2 minutes to form a dried film. The obtained dried film was subjected to whole surface integrated exposure to UV light of an ultrahigh pressure mercury lamp, of which the exposure power (exposure output) calculated for 365 nm was 25 mW/cm², via a photomask with masking portions (non-exposed portions) of 2.5×5 cm (exposure amount: 250 mJ/cm²). At the time of exposure, light of 330 nm or less was cut. Here, the spaced distance between the dried film and the photomask was set to be 50 μm.

Then, the glass substrate after the exposure treatment, was immersed in a 2.38% tetramethylammonium hydroxide aqueous solution for 40 seconds for development, followed by rinsing with water to remove non-exposed portions and then by drying. Then, it was heated on a hot plate at 230° C. for 60 minutes to obtain partition walls as a cured film having opening sections corresponding to masking portions of the photomask.

With respect to the obtained negative type photosensitive resin composition 1 and partition walls, the following evaluations were conducted. The evaluation results are shown in Table 3-1 and Table 3-2 (hereinafter, Table 3-1 and Table 3-2 may together be referred to as Table 3).

(Evaluations)
<Thickness of Partition Walls>
Measured by means of a laser microscope (manufactured by Keyence Corporation, apparatus name: VK-8500).
<Ink Repellency>
The static contact angle and the dynamic contact angle (dropping angle) were measured by the following methods to evaluate the ink repellency.
<Static Contact Angle>
The static contact angle with PGMEA at the upper surface of the partition walls obtained as described above, was measured by the following method.

By a sessile drop method, in accordance with JIS R3257 "Method for testing wettability of substrate glass surface", PGMEA droplets were put at three places on the upper surface of partition walls, and the measurement was made for each PGMEA droplet. A droplet was 2 μL/droplet, and the measurement was carried out at 20° C. The static contact angle was determined from the average of three measured values. The larger the static contact angle, the better the nature to suppress wet-spreading of ink, i.e. the better the ink repellency.
<Dynamic Contact Angle (Ink-dropping Properties)>

After placing PGMEA droplets of 5 μL on the partition wall surface of a horizontally held glass substrate provided with the partition walls, the glass substrate was gradually tilted, and the angle (dynamic contact angle=dropping angle) between the horizontal plane and the glass substrate provided with the partition walls at the time when the PGMEA droplets began to fall was measured by means of SA-11 (manufactured by Kyowa Interface Science Co., Ltd.). The measurement was performed at five different locations on the partition wall surface, and the average value was calculated. The smaller the dynamic contact angle (dropping angle), the better the ink-dropping properties.
<Storage Stability of Negative Photosensitive Resin Composition>

The negative photosensitive resin composition 1 was stored at room temperature (from 20 to 25° C.) for 20 days. Then, the state (transparent or turbid) of the negative photosensitive resin composition 1 was visually observed, whereupon partition walls (provided that the size of the glass substrate was 7.5 cm square) were produced in the same manner as above. Here, during the production, in the form of a coating film, the presence or absence of a foreign matter on the film surface was observed visually and by a laser microscope.

The outer appearance of the obtained partition walls and the presence or absence of a foreign matter on the film surface were observed visually and by a laser microscope, whereby they were compared with the partition walls formed in the same manner as above from the negative photosensitive resin composition 1 before the storage (provided that the size of the glass substrate was changed to 7.5 cm square), and evaluated in accordance with the following standards.

⊚: Even when the coating film is observed visually or by a laser microscope, no foreign matter is ascertained, and the outer appearance is the same as the partition walls formed from the negative photosensitive resin composition before the storage.

○: When the coating film is observed by a laser microscope, a particulate foreign matter is ascertained.

Δ: When the coating film is visually observed, a particulate foreign matter is ascertained.

x: The negative photosensitive resin composition after the storage gets turbid.

[Ex. 2 to 12]

A negative photosensitive resin composition and partition walls were produced in the same manner as in Ex. 1, except that the negative photosensitive resin composition was changed to the composition as shown in Table 3, and the same evaluations as in Ex. 1 were carried out. Here, Ex. 11 and Ex. 12 are Comparative Examples in which a solution of ink repellent agent (C11) and a solution of ink repellent agent (C12), being ink-repellent agents outside the scope of the present invention, were used.

The evaluation results of each Ex. are shown in Table 3 together with the composition of the negative photosensitive resin composition. In Table 3, "Ratio of solvent (E)" means the ratio of each solvent in the entire solvent (E). In Table 3, "Composition" represents a negative photosensitive composition.

TABLE 3

| | | | | | | | | | |
|---|---|---|---|---|---|---|---|---|---|
| | Components | | Compound • composition | Ex. 1 | Ex. 2 | Ex. 3 | Ex. 4 | Ex. 5 | Ex. 6 |
| Composition (g) | (A) | | Alkali-soluble resin (A1) composition | 12.66 | 13.04 | — | 13.30 | — | — |
| | | | Alkali-soluble resin (A2) composition | — | — | 13.04 | — | — | 13.04 |
| | | | Alkali-soluble resin (A3) composition | — | — | — | — | 13.04 | — |
| | (B) | | IR907 | 1.12 | 1.12 | 1.12 | 1.12 | 1.12 | 1.12 |
| | | | EAB | 1.00 | 1.00 | 1.00 | 1.00 | 1.00 | 1.00 |
| | (C) | | Ink repellent agent (C1) solution | 1.61 | — | s | — | — | — |
| | | | Ink repellent agent (C2) solution | — | 1.08 | — | — | — | — |
| | | | Ink repellent agent (C3) solution | — | — | 1.08 | — | — | — |
| | | | Ink repellent agent (C4) solution | — | — | — | 0.72 | — | — |

TABLE 3-continued

|  |  | Compound • composition | | | | | | |
|---|---|---|---|---|---|---|---|---|
|  |  | Ink repellent agent (C5) solution | — | — | — | — | 1.08 | — |
|  |  | Ink repellent agent (C6) solution | — | — | — | — | — | 1.08 |
|  |  | Ink repellent agent (C7) solution | — | — | — | — | — | — |
|  |  | Ink repellent agent (C8) solution | — | — | — | — | — | — |
|  |  | Ink repellent agent (C9) solution | — | — | — | — | — | — |
|  |  | Ink repellent agent (C10) solution | — | — | — | — | — | — |
|  |  | Ink repellent agent (C11) solution | — | — | — | — | — | — |
|  |  | Ink repellent agent (C12) solution | — | — | — | — | — | — |
|  | (D) | DPHA | 8.91 | 9.06 | 9.06 | 9.16 | 9.06 | 9.06 |
|  | (E) | PGME | 69.7 | 69.7 | 69.7 | 69.7 | 69.7 | 69.7 |
|  |  | IPA | 5.0 | 5.0 | 5.0 | 5.0 | 5.0 | 5.0 |
| Composition |  | Solid content concentration (mass %) | 20 | 20 | 20 | 20 | 20 | 20 |
| (mass %) | Ratio in | Alkali-soluble resin (A) | 44.2 | 44.7 | 44.7 | 45.1 | 44.7 | 44.7 |
|  | solid | Photopolymerization initiator (B) | 10.6 | 10.4 | 10.4 | 10.3 | 10.4 | 10.4 |
|  | content | Ink repellent agent (C) | 0.8 | 0.5 | 0.5 | 0.3 | 0.5 | 0.5 |
|  | (mass %) | Cross-linking agent (D) | 44.4 | 44.4 | 44.4 | 44.3 | 44.4 | 44.4 |
|  | Ratio of | PGMEA | 4.8 | 4.8 | 4.8 | 4.8 | 4.8 | 4.8 |
|  | solvent (E) | PGME | 91.2 | 91.2 | 91.2 | 91.2 | 91.2 | 91.2 |
|  | (mass %) | IPA | 4.0 | 4.0 | 4.0 | 4.0 | 4.0 | 4.0 |
| Evaluations | Partition walls | Thickness of partition walls (μm) | 2.1 | 2.1 | 2.0 | 2.1 | 1.9 | 2.0 |
|  |  | Static contact angle (degrees) | 44 | 47.1 | 45.8 | 48.2 | 46.9 | 46.7 |
|  |  | Dropping angle (degrees) | 14 | 15 | 14 | — | — | — |
|  | Composition | Storage stability (20 days) | ○ | ○ | ○ | ○ | ○ | ○ |

|  | Components | Compound • composition | Ex. 7 | Ex. 8 | Ex. 9 | Ex. 10 | Ex. 11 | Ex. 12 |
|---|---|---|---|---|---|---|---|---|
| Composition | (A) | Alkali-soluble resin (A1) composition | 13.04 | 13.04 | — | 13.04 | 13.04 | 13.04 |
| (g) |  | Alkali-soluble resin (A2) composition | — | — | — | — | — | — |
|  |  | Alkali-soluble resin (A3) composition | — | — | 13.04 | — | — | — |
|  | (B) | IR907 | 1.12 | 1.12 | 1.12 | 1.12 | 1.12 | 1.12 |
|  |  | EAB | 1.00 | 1.00 | 1.00 | 1.00 | 1.00 | 1.00 |
|  | (C) | Ink repellent agent (C1) solution | — | — | — | — | — | — |
|  |  | Ink repellent agent (C2) solution | — | — | — | — | — | — |
|  |  | Ink repellent agent (C3) solution | — | — | — | — | — | — |
|  |  | Ink repellent agent (C4) solution | — | — | — | — | — | — |
|  |  | Ink repellent agent (C5) solution | — | — | — | — | — | — |
|  |  | Ink repellent agent (C6) solution | — | — | — | — | — | — |
|  |  | Ink repellent agent (C7) solution | 1.08 | — | — | — | — | — |
|  |  | Ink repellent agent (C8) solution | — | 1.08 | — | — | — | — |
|  |  | Ink repellent agent (C9) solution | — | — | 1.08 | — | — | — |
|  |  | Ink repellent agent (C10) solution | — | — | — | 1.08 | — | — |
|  |  | Ink repellent agent (C11) solution | — | — | — | — | 1.08 | — |
|  |  | Ink repellent agent (C12) solution | — | — | — | — | — | 1.08 |
|  | (D) | DPHA | 9.06 | 9.06 | 9.06 | 9.06 | 9.06 | 9.06 |
|  | (E) | PGME | 69.7 | 69.7 | 69.7 | 69.7 | 69.7 | 69.7 |
|  |  | IPA | 5.0 | 5.0 | 5.0 | 5.0 | 5.0 | 5.0 |
| Composition |  | Solid content concentration (mass %) | 20 | 20 | 20 | 20 | 20 | 20 |
| (mass %) | Ratio in | Alkali-soluble resin (A) | 44.7 | 44.7 | 44.7 | 44.7 | 44.7 | 44.7 |
|  | solid | Photopolymerization initiator (B) | 10.4 | 10.4 | 10.4 | 10.4 | 10.4 | 10.4 |
|  | content | Ink repellent agent (C) | 0.5 | 0.5 | 0.5 | 0.5 | 0.5 | 0.5 |
|  | (mass %) | Cross-linking agent (D) | 44.4 | 44.4 | 44.4 | 44.4 | 44.4 | 44.4 |
|  | Ratio of | PGMEA | 4.8 | 4.8 | 4.8 | 4.8 | 4.8 | 4.8 |
|  | solvent (E) | PGME | 91.2 | 91.2 | 91.2 | 91.2 | 91.2 | 91.2 |
|  | (mass %) | IPA | 4.0 | 4.0 | 4.0 | 4.0 | 4.0 | 4.0 |
| Evaluations | Partition walls | Thickness of partition walls (μm) | 2.0 | 2.0 | 1.9 | 2.1 | 2.1 | 2.1 |
|  |  | Static contact angle (degrees) | 49 | 46.7 | 46.4 | 47.1 | 44.8 | 30.7 |
|  |  | Dropping angle (degrees) | — | — | — | — | 24 | — |
|  | Composition | Storage stability (20 days) | ◎ | ○ | ◎ | ○ | X | ○ |

In Ex. 1 to 10 corresponding to Examples for the negative photosensitive resin composition of the present invention, the ink-repellent agent (C) is contained, which is obtained by using a hydrolyzable silane compound (s1) having a fluorinated organic group having an etheric oxygen atom, and thus, the upper surface of partition walls obtained by using it, is excellent in ink repellency. That is, in addition to good ink repellency, it is excellent also in ink-dropping properties. Further, the negative photosensitive resin composition is one having storage stability.

On the other hand, in Ex. 11 and Ex. 12 corresponding to Comparative Examples, in the ink repellent agent (C11) and the ink repellent agent (C12) used, the fluorinated hydrolyzable silane compound of comparative compound (cf-1) used as a raw material does not have an etheric oxygen atom, although it has a fluorinated organic group, and therefore, the upper surface of partition walls obtained by using the negative photosensitive resin composition containing the same, is insufficient in ink repellency. In other words, it does not sufficiently repel ink, or even if it repels ink, the ink-dropping properties are not enough.

[Composition Analysis of Surface of Partition Walls]

The composition of the surface of partition walls prepared in each of Ex. 2 (Example of the present invention) and Ex. 11 (Comparative Example) was analyzed by XPS. The apparatus used for the analysis by XPS was Quantera-SXM manufactured by ULVAC-PHI, Inc. and the conditions were as mentioned above.

As the results relating to the partition wall surface in Ex. 2, the obtained spectra of XPS analyses are shown in FIGS.

Figure 4A:
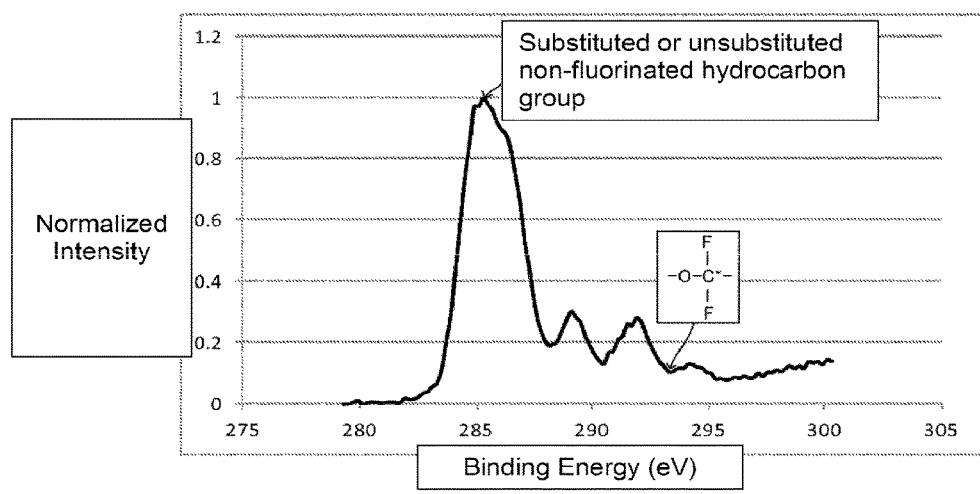
FIG. 4A is a chart showing the results of a composition analysis (C1s) at the surface, by XPS, of a cured resin film in a Comparative Example.
Figure 4B:
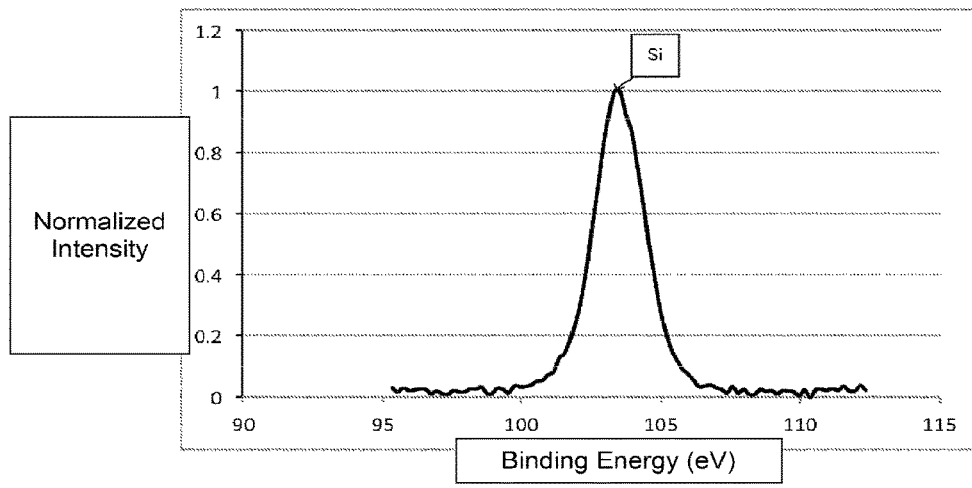
FIG. 4B is a chart showing the results of a composition analysis (Si2p) at the surface, by XPS, of a cured resin film in a Comparative Example.

1A, 1B, 1C and 1D with respect to C1s, Si2p, O1s, and F1s, respectively. As the results relating to the partition wall surface in Ex. 11, the obtained spectra are shown in FIG. 4A with respect to C1s, and in FIG. 4B with respect to Si2p. Here, with respect to O1s and F1s relating to the partition wall surface in Ex. 11, XPS spectra themselves are not shown, and only the values of the obtained atomic concentrations are shown.

With respect to the partition wall surfaces in Ex. 2 and Ex. 11, the atomic concentrations of carbon atoms, oxygen atoms, fluorine atoms and silicon atoms, which are, respectively, calculated from the peak areas of the respective peaks derived from C1s, O1s, F1s and Si2p in the obtained XPS spectra, are shown in Table 4.

Further, with respect to the partition wall surface in Ex. 2 and Ex. 11, the atomic concentration of C1s derived from substituted or unsubstituted non-fluorinated hydrocarbon groups, and the atomic concentration of C1s derived from —O—$CF_2$— groups were obtained from the XPS spectra shown in FIG. 1A and FIG. 4A. Further, a value obtained by subtracting the atomic concentration of C1s derived from substituted or unsubstituted non-fluorinated hydrocarbon groups and the atomic concentration of C1s derived from derived from —O—$CF_2$— groups, from the atomic concentration of all carbon atoms as obtained above, was taken as the atomic concentration of C1s derived from other carbon atoms. The results are also shown in Table 4.

TABLE 4

| | | Analytical peaks | | | | | | |
|---|---|---|---|---|---|---|---|---|
| | | C1s | | | | O1s Oxygen | F1s Fluorine | Si2p silicon |
| Type of atom | | $C_H$ | $C_{FO}$ | $C_{ot}$ | $C_{all}$ | | | |
| Atomic concentration of each atom (atomic %) | Ex. 2 | 35.5 | 6.5 | 4.3 | 46.3 | 27.9 | 21.4 | 4.4 |
| | Ex. 11 | 40.0 | 0 | 11.2 | 51.2 | 23.9 | 21.0 | 3.9 |

From the atomic concentrations of the respective peaks shown in Table 4, $[C_{FO}/C_H]_{(s)}$ and $[Si/C_H]_{(s)}$ of the surface of partition walls prepared in each of Ex. 2 (Example of the present invention) and Ex. 11 (Comparative Example) were calculated. The results are shown in Table 5.

TABLE 5

| | Ex. 2 | Ex. 11 |
|---|---|---|
| $[C_{FO}/C_H]_{(s)}$ | 0.18 | 0 |
| $[Si/C_H]_{(s)}$ | 0.12 | 0.10 |

In Ex. 2 as Example of the present invention, at the partition wall surface, the presence of carbon atoms derived from —O—$CF_2$— groups and silicon atoms, was confirmed. On the other hand, in Ex. 11 as Comparative Example, the presence of silicon atoms was confirmed, but carbon atoms derived from —O—$CF_2$— groups were not observed, at the partition wall surface.

Further, by analyzing the composition of the interior of partition walls prepared in each of Ex. 2 (Example of the present invention) and Ex. 11 (Comparative Example) by XPS (however, in this case, an XPS analysis apparatus using an Ar cluster sputtering ions is used), $[C_{FO}/C_H]_{(i)}$ and $[Si/CH]_{(i)}$ can be calculated in the same manner as in the case of the above surface. From these results and the above $[C_{FO}/C_H]_{(s)}$ and $[Si/C_H]_{(s)}$ at the surface, the relationship of $[C_{FO}/C_H]_{(s)}>[C_{FO}/C_H]_{(i)}$ and the relationship of $[Si/C_H]_{(s)}>[Si/C_H]_{(i)}$ can be confirmed. Here, as mentioned above, at the time of comparing the results of XPS analyses of the surface and the interior of partition walls, it is preferred to carry out the XPS analysis of the partition wall surface by using an XPS analysis apparatus using the same Ar cluster sputter ions as used for the XPS analysis of the interior of partition walls and to compare the results obtained with each other.

At the surface of partition walls in Ex. 2 corresponding to Example of the present invention, the presence of carbon atoms derived from —O—$CF_2$— groups, silicon atoms and fluorine atoms, was confirmed. Further, each of the ratios of the silicon atom concentration and the carbon atom concentration derived from —O—$CF_2$— groups, to the carbon atom concentration derived from substituted or unsubstituted non-fluorinated hydrocarbon groups, is considered to be larger at the surface than at the interior. By such a construction of partition walls, the upper surface of partition walls in Ex. 2 is excellent in ink repellency. That is, it repels ink well, and at the same time, it is excellent in the ink-dropping properties.

On the other hand, in Ex. 11 corresponding to Comparative Example, at the surface of partition walls, the presence of carbon atoms derived from —O—$CF_2$— groups was not confirmed. Further, at the surface of partition walls in Ex. 11 corresponding to Comparative Example, the presence of fluorine atoms was confirmed similar to the partition walls in Ex. 2 corresponding to Example of the present invention. By such a construction of the surface, the upper surface of partition walls in Ex. 11 has good ink repelling properties, but is not sufficient in ink-dropping properties. That is, the ink repellency of the upper surface of partition walls in Ex. 11 can be said to be not enough on the whole.

INDUSTRIAL APPLICABILITY

The negative photosensitive resin composition of the present invention is useful as a composition for e.g. forming partition walls at the time of carrying out pattern printing by an IJ method in an optical element such as an organic EL element, or a color filter, TFT array or the like of a liquid crystal element.

The partition walls of the present invention can be utilized as partition walls (banks) for pattern printing by an IJ method of an organic layer such as a light-emitting layer, in an organic EL device, or partition walls for pattern printing by an IJ method of a color filter in a liquid crystal element (these partition walls may also serve as a black matrix (BM).

The partition walls of the present invention can also be utilized as partition walls, etc. for pattern printing by an IJ method of a conductor pattern or a semiconductor pattern in a TFT array.

The partition walls of the present invention may be utilized, for example, as partition walls for pattern printing by an IJ method of e.g. a semiconductor layer constituting a channel layer of TFT, a gate electrode, a source electrode, a drain electrode, a gate wiring, and a source wiring.

This application is a continuation of PCT Application No. PCT/JP2014/083046, filed on Dec. 12, 2014, which is based upon and claims the benefit of priority from Japanese Patent Application No. 2013-260083 filed on Dec. 17, 2013. The contents of those applications are incorporated herein by reference in their entireties.

REFERENCE SYMBOLS

1: substrate, 21: coating film, 22: dried film, 23: exposed film, 23A: exposed portion, 23B: non-exposed portion, 4:

partition wall, 4A: ink repellent layer, 5: opening section, 31: masking portion, 30: photomask, 9: ink-jet head, 10: ink, 11: dot, 12: optical element.

What is claimed is:

1. A negative photosensitive resin composition comprising:
   (A) an alkali-soluble resin or alkali-soluble monomer, which has a photo-curability,
   (B) a photopolymerization initiator, and
   (C) an ink repellent agent which has a fluorine atom content of at least 1 mass % and less than 10 mass % and which is a partially hydrolyzed condensate of a hydrolyzable silane compound mixture containing a hydrolyzable silane compound (s1) having a hydrolyzable group and a $C_{2-40}$ monovalent group represented by $R^{f1}OR^{f2}$—, wherein $R^{f1}$ is a $C_{1-6}$ polyfluoroalkyl group, and $R^{f2}$ is a polyfluoroalkylene group which may have an etheric oxygen atom between carbon-carbon atoms, provided that $R^{f1}OR^{f2}$— has at least one —O—$CF_2$— group.

2. The negative photosensitive resin composition according to claim 1, wherein the hydrolyzable silane compound (s1) is a compound represented by the following formula (cx-1):

(cx-1)

where $Q^1$ represents a $C_{1-10}$ divalent organic group containing no fluorine atom,
   $R^{H1}$ represents a $C_{1-6}$ monovalent hydrocarbon group,
   a represents 1 or 2, and b represents 0 or 1, provided a +b is 1 or 2, and
   $X^1$ represents a hydrolyzable group.

3. The negative photosensitive resin composition according to claim 1, wherein $R^{f1}$ is a perfluoroalkyl group, and $R^{f2}$ is a perfluoroalkylene group.

4. The negative photosensitive resin composition according to claim 1, wherein the hydrolyzable silane compound mixture comprises a hydrolyzable silane compound (s2) having four hydrolyzable groups bonded to a silicon atom.

5. The negative photosensitive resin composition according to claim 1, wherein the hydrolyzable silane compound mixture further comprises a hydrolyzable silane compound (s3) having a group containing an ethylenic double bond and a hydrolyzable group and containing no fluorine atoms.

6. The negative photosensitive resin composition according to claim 1, wherein the fluorine atom content of the ink repellent agent (C) is at least 2 mass % and less than 10 mass %.

7. The negative photosensitive resin composition according to claim 1, further comprising a cross-linking agent (D) having at least two ethylenic double bonds in one molecule and having no acidic group.

8. A resin film comprising a cured product of the negative photosensitive resin composition as defined in claim 1.

9. The resin film according to claim 8,
   wherein the resin film is formed on a substrate, and
   in a composition analysis at a surface of the resin film and a composition analysis in an interior of the resin film in a thickness direction thereof by X-ray photoelectron spectroscopy (XPS),
   at least at the surface of the resin film, peaks indicating a presence of silicon atoms and carbon atoms derived from —O—$CF_2$— groups are measured,
   a ratio of a concentration of carbon atoms derived from —O—$CF_2$— groups to a concentration of carbon atoms derived from substituted or unsubstituted non-fluorinated hydrocarbon groups, at the surface of the resin film, $[C_{FO}/C_H](s)$, is larger than a ratio of a concentration of carbon atoms derived from —O—$CF_2$— groups to a concentration of carbon atoms derived from substituted or unsubstituted non-fluorinated hydrocarbon groups, at the interior of the resin film, $[C_{FO}/C_H]_{(i)}$, and
   a ratio of a concentration of silicon atoms to a concentration of carbon atoms derived from substituted or unsubstituted non-fluorinated hydrocarbon groups, at the surface of the resin film, $[Si/C_H]_{(s)}$, is larger than a ratio of a concentration of silicon atoms to a concentration of carbon atoms derived from substituted or unsubstituted non-fluorinated hydrocarbon groups, at the interior of the resin film, $[Si/C_H]_{(i)}$.

10. A partitioned substrate comprising:
    a substrate; and
    partition walls formed on a surface of the substrate to partition the surface into a plurality of compartments for forming dots and made of the resin film as defined in claim 8.

11. An optical element comprising:
    a substrate;
    dots formed on a surface of the substrate; and
    partition walls located between one of the dots and a dot adjacent to the one of the dots and formed of the resin film as defined in claim 9.

12. The optical element according to claim 11, wherein the dots are formed by an ink jet method.

13. The negative photosensitive resin composition according to claim 1, wherein $R^{f1}$ is a perfluoroalkyl group, and $R^{f2}$ is a perfluoroalkylene group having an etheric oxygen atom.

14. The negative photosensitive resin composition according to claim 1, wherein the fluorine atom content of the ink repellent agent (C) is at least 1 mass % and at most 8 mass %.

* * * * *